(12) United States Patent  
Kuwahara et al.

(10) Patent No.: US 12,470,229 B2  
(45) Date of Patent: Nov. 11, 2025

(54) AD CONVERSION DEVICE

(71) Applicant: Mitsubishi Electric Corporation, Tokyo (JP)

(72) Inventors: Takashi Kuwahara, Tokyo (JP); Yoshihiro Akeboshi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 206 days.

(21) Appl. No.: 18/387,183

(22) Filed: Nov. 6, 2023

(65) Prior Publication Data

US 2024/0072819 A1   Feb. 29, 2024

Related U.S. Application Data

(63) Continuation of application No. PCT/JP2022/023557, filed on Jun. 13, 2022.

(30) Foreign Application Priority Data

Jun. 18, 2021   (WO) .................. PCT/JP2021/023158

(51) Int. Cl.  
    *H03M 1/34*      (2006.01)  
    *H03M 1/12*      (2006.01)

(52) U.S. Cl.  
    CPC ............. *H03M 1/124* (2013.01); *H03M 1/34* (2013.01)

(58) Field of Classification Search  
    CPC .. H03M 1/0626; H03M 3/462; H03M 1/1245; H03M 3/402; H03M 3/422;

(Continued)

(56) References Cited

U.S. PATENT DOCUMENTS 4,831,464 A * 5/1989 Chijiiwa .......... G11B 20/10527  
                                                      360/32  
4,833,474 A * 5/1989 Nagai ................... H03M 3/324  
                                                      708/313

(Continued)

FOREIGN PATENT DOCUMENTS

| JP | 3-94833 U | 9/1991 |
| JP | 2010-16768 A | 1/2010 |
| JP | 2010-223645 A | 10/2010 |

OTHER PUBLICATIONS

International Search Report (PCT/ISA/210) issued in PCT/JP2022/023557, mailed on Sep. 6, 2022.

(Continued)

*Primary Examiner* — Linh V Nguyen  
(74) *Attorney, Agent, or Firm* — Birch, Stewart, Kolasch & Birch, LLP

(57) ABSTRACT

An AD conversion device includes an AD converter that outputs an analog signal as sampling data for every sampling point based on a sampling frequency, a controller, and a storage circuit, the controller includes a buffer memory which temporarily stores the sampling data from the AD converter in time series and from which the sampling data is read out in time series, and a decimation controller, the decimation controller outputs a write-enable signal indicating write-enabled for the selected sampling data in the decimation region and the sampling data in the high-speed sampling region, and outputs decimation bit information indicating whether the sampling data is the sampling data of the decimation region or the sampling data of the high-speed sampling region, and the storage circuit stores the sampling data stored in the buffer memory in association with the decimation bit information, in response to the write-enable signal.

16 Claims, 14 Drawing Sheets

(58) Field of Classification Search
CPC ...... H03M 3/436; H03M 3/468; H03M 3/404; H03M 3/414; H03M 1/56; H03M 13/23; H03M 13/41; H03M 13/4169; H03M 13/6527; H03M 3/042; H03M 3/344; H03M 3/358; H03M 3/386; H03M 3/498; H03M 1/124; H03M 1/1265; H03M 1/127; H03M 1/34; H03M 3/47; H03M 3/49; H03M 3/504; H03M 3/508; H03M 7/3028; H03M 7/3035
USPC .......................... 341/118–120, 155, 164, 165
See application file for complete search history.

(56) References Cited

U.S. PATENT DOCUMENTS

| | | | | | |
|---|---|---|---|---|---|
| 4,968,987 | A | * | 11/1990 | Naka | H03M 3/328 |
| | | | | | 375/247 |
| 5,479,168 | A | * | 12/1995 | Johnson | G11B 20/10527 |
| | | | | | 360/32 |
| 5,619,202 | A | * | 4/1997 | Wilson | H03M 3/372 |
| | | | | | 341/123 |
| 5,963,160 | A | * | 10/1999 | Wilson | H03L 7/08 |
| | | | | | 341/61 |
| 6,208,279 | B1 | * | 3/2001 | Oprescu | H03M 3/374 |
| | | | | | 341/143 |
| 6,901,146 | B1 | * | 5/2005 | Taura | H03D 3/006 |
| | | | | | 381/3 |
| 7,193,544 | B1 | * | 3/2007 | Fitelson | H03M 3/396 |
| | | | | | 341/143 |
| 8,654,468 | B2 | * | 2/2014 | Morling | G11B 20/10046 |
| | | | | | 360/39 |
| 2015/0200679 | A1 | * | 7/2015 | Stein | H03D 7/165 |
| | | | | | 341/155 |
| 2017/0324423 | A1 | * | 11/2017 | Tangudu | H03D 7/165 |

OTHER PUBLICATIONS

Notice of Reasons for Refusal dated Feb. 28, 2023 in Japanese Patent Application No. 2022-570103.

* cited by examiner

AD CONVERSION DEVICE

CROSS REFERENCE TO RELATED APPLICATIONS

This application is a Continuation of PCT International Application No. PCT/JP2022/023557 filed on Jun. 13, 2022, which claims priority under 35 U.S.C. 119(a) to PCT International Application No. PCT/JP2021/023158, filed in Japan on Jun. 18, 2021, all of which are hereby expressly incorporated by reference into the present application.

TECHNICAL FIELD

The present disclosure relates to an AD conversion device including an AD converter that samples an analog signal with a sampling frequency, converts the analog signal into digital data, and outputs the digital data as sampling data, and a storage unit that stores the sampling data output from the AD converter.

BACKGROUND ART

In various sensing devices and wireless communication devices, an AD conversion device including an AD converter and a storage unit is used.

In general, since the sampling frequency of the AD converter is designed depending on the frequency of the input analog signal (twice or more the Nyquist frequency), for example, in a case where a high-frequency signal such as an impulse signal having a steep temporal change is superimposed on the analog signal and input, it is necessary to increase the sampling frequency in accordance with the high-frequency signal.

When the sampling frequency increases, the storage capacity of the storage unit that stores the sampling data also needs to be increased, and the amount of sampling data to be handled increases, so that the peripheral circuit and the like also become complicated and large in scale.

Patent Literature 1 discloses a waveform recording device including an analog input unit, an alarm detection unit, an A/D conversion unit, a buffer memory, a memory control unit, an acquisition memory, an alarm address memory, a recording control unit, a recording medium, a display control unit, a waveform display unit, an alarm information display unit, and an operation unit.

The A/D conversion unit samples the analog signal at a predetermined sampling interval, and converts the analog signal into time-series data (waveform data) including a time stamp indicating a sampling time and a data body indicating a level of the analog signal.

The buffer memory sequentially stores the waveform data sequentially input from the A/D conversion unit, sequentially reads the waveform data from the previously stored waveform data, and outputs the waveform data to the memory control unit.

On the basis of the abnormality detection signal input from the alarm detection unit, the memory control unit stores abnormal waveform data input from the buffer memory in the acquisition memory without any processing, and stores normal waveform data input from the buffer memory in the acquisition memory by decimating the normal waveform data at a constant rate.

In addition, a data number of the abnormal waveform data is stored as an alarm address in the alarm address memory.

In the recording medium, the waveform data from the acquisition memory and the storage address of the abnormal waveform data are stored by the recording control unit.

CITATION LIST

Patent Literature

Patent Literature 1: JP 2010-223645 A

SUMMARY OF INVENTION

Technical Problem

In the waveform recording device disclosed in Patent Literature 1, since the memory control unit thins out the normal waveform data input from the buffer memory at a constant rate and stores the data in the acquisition memory, the storage capacity of the acquisition memory can be reduced as compared with the case where all pieces of normal waveform data are stored in the acquisition memory.

However, the time stamp indicating the sampling time is included as the waveform data, and thus the waveform recording device includes an inhibiting factor of the capacity reduction of the acquisition memory and the recording medium.

The present disclosure has been made in view of the above points, and an object of the present disclosure is to provide an AD conversion device capable of reducing a storage capacity (memory amount) of a storage unit that stores sampling data output from an AD converter.

Solution to Problem

An AD conversion device according to the present disclosure includes: an AD converter to convert an analog signal into digital data for every sampling point based on a sampling frequency and to output the digital data as sampling data for every sampling point; a controller including a buffer memory in which the sampling data from the AD converter is temporarily stored in time series and from which the sampling data is read out in time series, and a decimation controller, wherein the decimation controller monitors whether or not the analog signal contains a high-frequency component, when the analog signal contains the high-frequency component, uses a sampling point in the sampling data from the AD converter, containing the high-frequency component, as a reference point, sets a region having the reference point and sampling points before and after the reference point, as a high-speed sampling region, sets a region other than the high-speed sampling region, as a decimation region in which sampling is performed at a decimation rate of $1/N_0$ for selecting one sampling point from $N_0$ sampling points, outputs a write-enable signal indicating write-enabled for sampling data at the selected sampling point for every $N_0$ sampling points among the sampling points in the decimation region and sampling data at all sampling points in at least a partial region in the high-speed sampling region, and outputs decimation bit information indicating whether the sampling data is sampling data at a sampling point in the decimation region or sampling data at a sampling point in the high-speed sampling region; and a storage circuit to receive the sampling data stored in the buffer memory, the write-enable signal and the decimation bit information from the decimation controller, and to store the sampling data stored in the buffer memory at a sampling point at which the write-enable signal indicating write-enabled is received from the decimation controller and the decimation bit information from the decimation controller in association with each other, wherein the decimation controller includes: a counter to operate with the $N_0$ as an upper limit value of a count value and to output the count value: a trigger determiner to monitor whether or not the analog signal contains a high-frequency component with the sampling data from the AD converter, and to detect a sampling point in the sampling data containing the high-frequency component as a trigger point; and a decimation determiner to use a reference point of the high-speed sampling region as the trigger point detected by the trigger determiner, and to determine the selected sampling point for every $N_0$ sampling points among the sampling points in the decimation region with a count value from the counter, and the buffer memory stores the count value from the counter for every sampling point in association with the sampling data from the AD converter.

Advantageous Effects of Invention

According to the present disclosure, the sampling data in the decimation region other than the high-speed sampling region containing the high-frequency component in the analog signal is sampled at the decimation rate of $1/N_0$, and the sampled sampling data is stored in the storage circuit in association with the decimation bit information, so that the storage capacity of the storage circuit can be reduced. In addition, since the sampling data in the decimation controller and the buffer memory is made to correspond to the count value from the counter that operates with the $N_0$ as the upper limit value of the count value, management of the absolute time for the sampling data stored in the storage circuit can be made unnecessary.

DESCRIPTION OF EMBODIMENTS

First Embodiment

Figure 1:
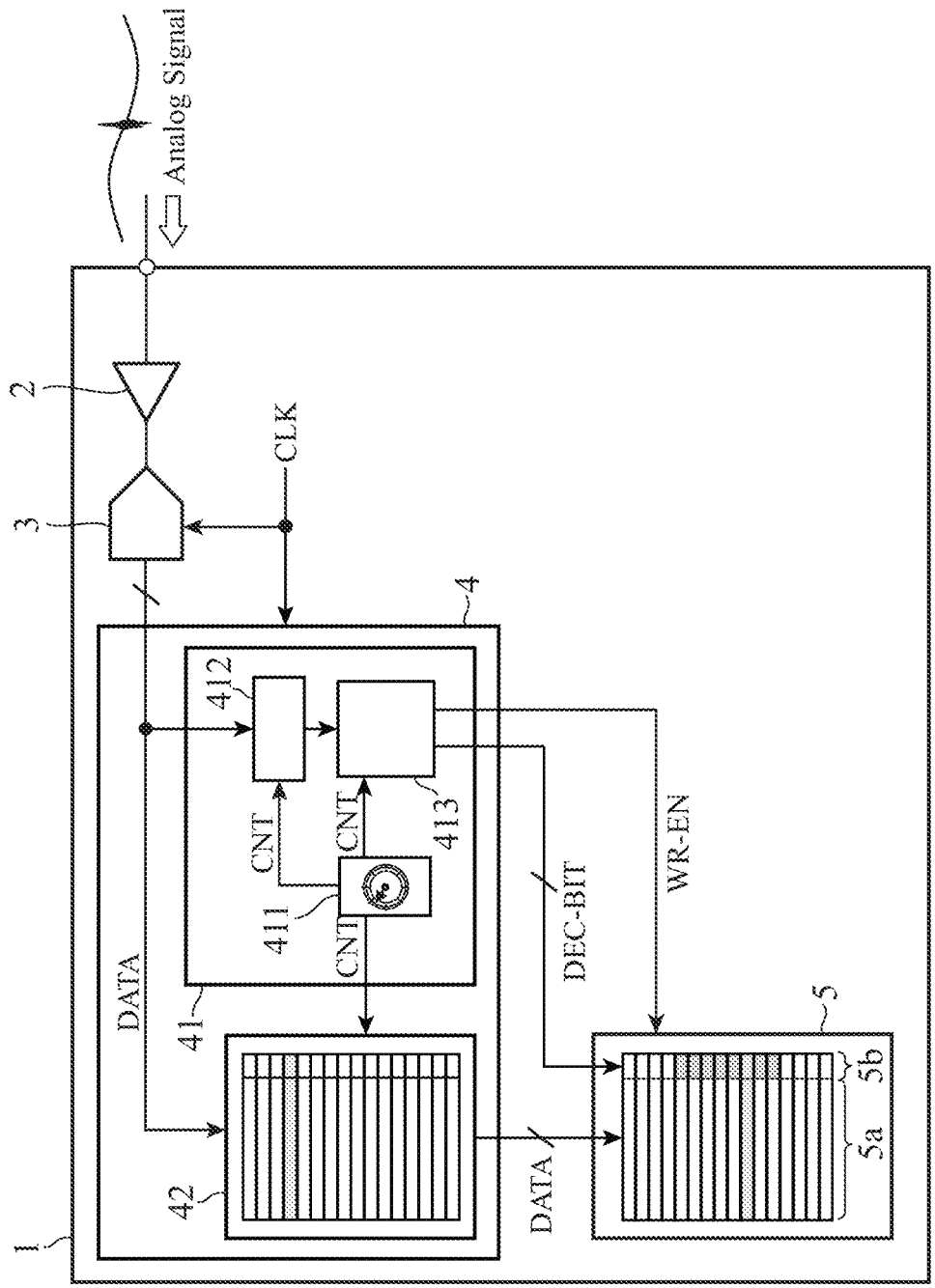
FIG. 1 is a block diagram illustrating an AD conversion device according to a first embodiment.

An AD conversion device 1 according to a first embodiment will be described with reference to FIGS. 1 to 4.

The AD conversion device 1 includes an amplifier (AMP) circuit 2, an AD converter 3, a control unit 4, and a storage unit 5.

The amplifier circuit 2 amplifies and outputs an analog signal input temporally continuously.

The AD converter 3 converts the analog signal from the amplifier circuit 2 into a digital signal in synchronization with a clock signal CLK.

That is, the AD converter 3 converts the analog signal from the amplifier circuit 2 into digital data for every sampling point based on the sampling frequency, and outputs the digital data as sampling data for every sampling point.

In FIG. 1, the sampling data is indicated as DATA. The same applies to the other drawings.

The sampling frequency is a frequency of the clock signal CLK input to the AD converter 3.

The frequency of the clock signal CLK is twice or more the Nyquist frequency depending on the high-frequency signal, such as the impulse noise (impulse signal) with steep temporal change, superimposed on the analog signal.

The sampling data is data that digitally indicates the value (level, crest amplitude) of the analog signal at the sampling point, and is 10 bit (Bit) data as an example.

The control unit 4 has a function of temporarily storing the sampling data output from the AD converter 3 in time series in association with the count value in synchronization with the clock signal CLK, a function of monitoring the sampling data output from the AD converter 3 and detecting whether the sampling data is in a high-speed sampling region HR or a decimation region DR in which decimation processing is performed, and a function of reading the temporarily stored sampling data in time series in synchronization with the clock signal CLK and outputting a write-enable signal and decimation bit information for the read sampling data.

In FIG. 1, the write-enable signal is indicated by WR-EN, and the decimation bit information is indicated by DEC-BIT. The same applies to the other drawings.

The write-enable signal is a signal indicating whether or not the storage unit 5 stores read sampling data, and includes one bit, and "1" indicates write-enabled, and "0" indicates write-disabled.

The decimation bit information is a signal indicating whether the read sampling data is the sampling data in the high-speed sampling region HR or the sampling data in the decimation region DR, and includes one bit. "1" indicates the sampling data in the decimation region DR, and "0" indicates the sampling data in the high-speed sampling region HR.

The control unit 4 includes a decimation control unit 41 and a buffer memory 42.

Figure 2:
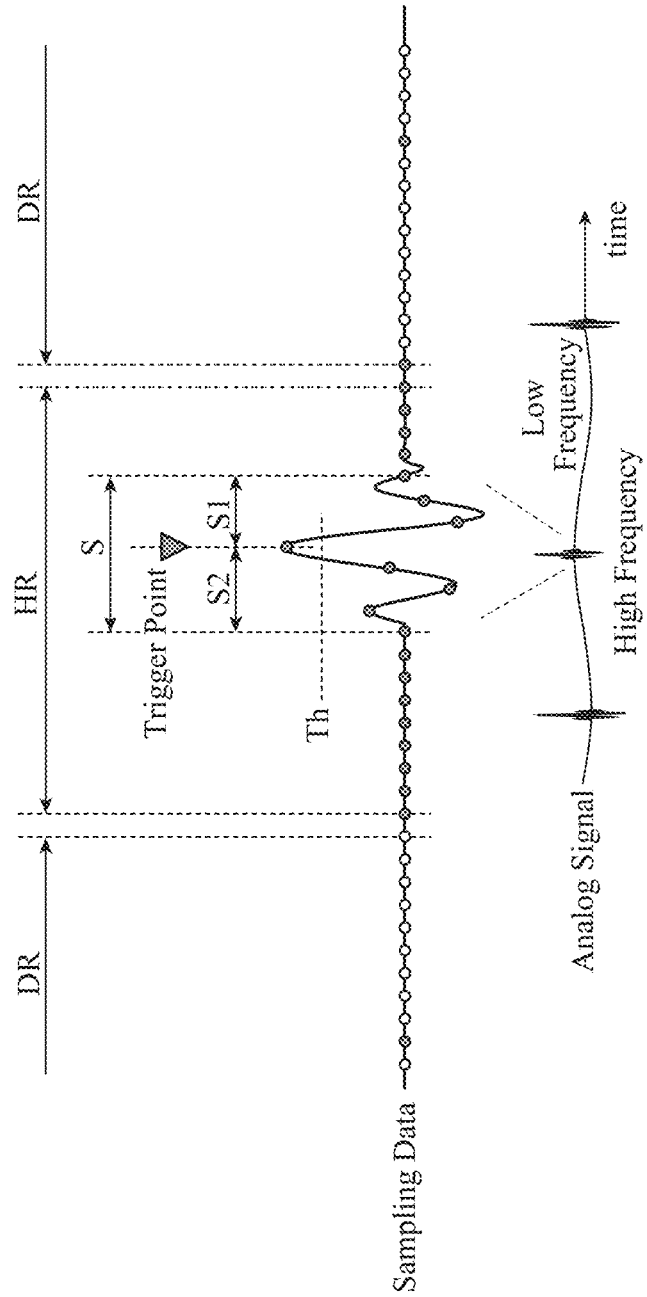
FIG. 2 is a diagram illustrating a relationship between a waveform of an analog input signal and sample points in the AD conversion device according to the first embodiment.

The decimation control unit 41 monitors whether or not the analog signal contains a high-frequency component, and when the analog signal contains a high-frequency component, as illustrated in FIG. 2, uses a sampling point in sampling data from the AD converter 3, containing a high-frequency component, as a reference point (trigger point), sets a region having a plurality of sampling points including the reference point and sampling points before and after the reference point, as the high-speed sampling region HR, and sets a region other than the high-speed sampling region HR as the decimation region DR in which sampling is performed at a decimation rate of $1/N_0$ for selecting one sampling point from $N_0$ sampling points.

The pulse length S including the trigger point illustrated in FIG. 2 is a pulse length of the impulse signal to be monitored. The pulse length S is indicated by the number of sampling points, and $N_0$ is set to a large value with respect to the pulse length S assumed in advance.

As an example, assuming that the previously-assumed pulse length S is a pulse length of a region including eight sampling points, $N_0$ is set to 10.

In addition, the pulse length S is defined such that the pulse length of a region including the plurality of sampling points in the preceding stage of the trigger point is a pre-trigger sample pulse length S1, the pulse length of a region including the sampling points in the subsequent stage including the trigger point is a post-trigger sample pulse length S2, and S=S1+S2.

In this example, the pre-trigger sample pulse length S1 is a pulse length of a region including four sampling points, and the post-trigger sample pulse length S2 is a pulse length of a region including four sampling points.

The high-speed sampling region HR including the pulse length S is a region including $2N_0$ sampling points that are twice $N_0$ for determining the decimation rate of the decimation region DR, that is, 20 sampling points in this example.

That is, as an example, the high-speed sampling region HR is a region including 20 sampling points obtained by adding a region including four sampling points in the preceding stage of the pulse length S and eight sampling points in the subsequent stage.

The write-enable signal indicating write-enabled is given to all sampling data for $2N_0$ (20) sampling points in the high-speed sampling region HR.

Note that, since the impulse signal is generated only at $2N_0$ sampling points before and after the trigger point, the high-speed sampling region HR only needs to be a region including $2N_0$ sampling points including the trigger point, and may be a region including the same number of sampling points before and after the trigger point with the trigger point as a center.

In short, the high-speed sampling region HR only needs to satisfy a region including $2N_0$ sampling points including the trigger point.

In this way, by setting the high-speed sampling region HR including $2N_0$ sampling points, the impulse signal is always included in the high-speed sampling region HR.

The high-speed sampling region HR only needs to be a region including at least sampling points of the sum of $N_0$ for determining the decimation rate of the decimation region DR and the pre-trigger sample pulse length S1.

On the other hand, a write-enable signal indicating write-enabled is given to sampling data for $N_0$ sampling points in the decimation region DR, that is, one sampling point among 10 sampling points in the first embodiment, and a write-enable signal indicating write-disabled is given to sampling data for the remaining $(N_0-1)$ sampling points, that is, nine sampling points in the first embodiment.

That is, in the decimation region DR, the write-enable signal indicating write-enabled is given to the sampling data for the sampling point at the ratio of the decimation rate of $1/N_0$.

Therefore, the decimation control unit 41 outputs the write-enable signal indicating write-enabled for sampling data at the selected sampling point for every $N_0$ sampling points among the sampling points in the decimation region DR and sampling data at all sampling points in at least a partial region in the high-speed sampling region HR, that is, at all sampling points in the high-speed sampling region HR in the first embodiment.

In FIG. 2, sampling points in the sampling data to which the write-enable signal indicating write-enabled is given are indicated by black circles, and sampling points in the sampling data to which the write-enable signal indicating write-disabled is given are indicated by white circles.

Furthermore, the decimation control unit 41 outputs decimation bit information indicating whether the sampling data is sampling data at a sampling point in the decimation region DR or sampling data at a sampling point in the high-speed sampling region HR.

The decimation control unit 41 includes a counter 411, a trigger determination unit 412, and a decimation determination unit 413.

The counter 411 operates with $N_0$ as an upper limit value of a count value CNT, and outputs the count value CNT.

The count value CNT of the counter 411 is provided to the trigger determination unit 412 and the decimation determination unit 413, and is provided to the buffer memory 42.

The counter 411 is used to label the sampling data from the AD converter 3 temporarily stored in time series with the count value CNT.

The counter 411 is a free-run counter that continuously and repeatedly counts the number $N_0$ from $(N_0-1)$ to 0 in synchronization with the clock signal CLK.

That is, the counter 411 is sequentially subtracted by 1 from the count value $(N_0-1)$, and when the count value becomes 0, the counter is reset and outputs a count value that is sequentially subtracted by 1 from the count value $(N_0-1)$.

The trigger determination unit 412 monitors whether or not the analog signal contains a high-frequency component with the sampling data from the AD converter 3, and detects a sampling point in the sampling data containing a high-frequency component as a trigger point that is a reference point.

The trigger determination unit 412 monitors sampling data from the AD converter 3 input for every sampling point in time series in synchronization with the clock signal CLK, and detects sampling data containing a high-frequency component.

In short, the trigger determination unit 412 monitors the sampling data from the AD converter 3 in real time, detects the impulse signal in real time, and gives the trigger point at which the impulse signal has been detected to the decimation determination unit 413.

Figure 3:
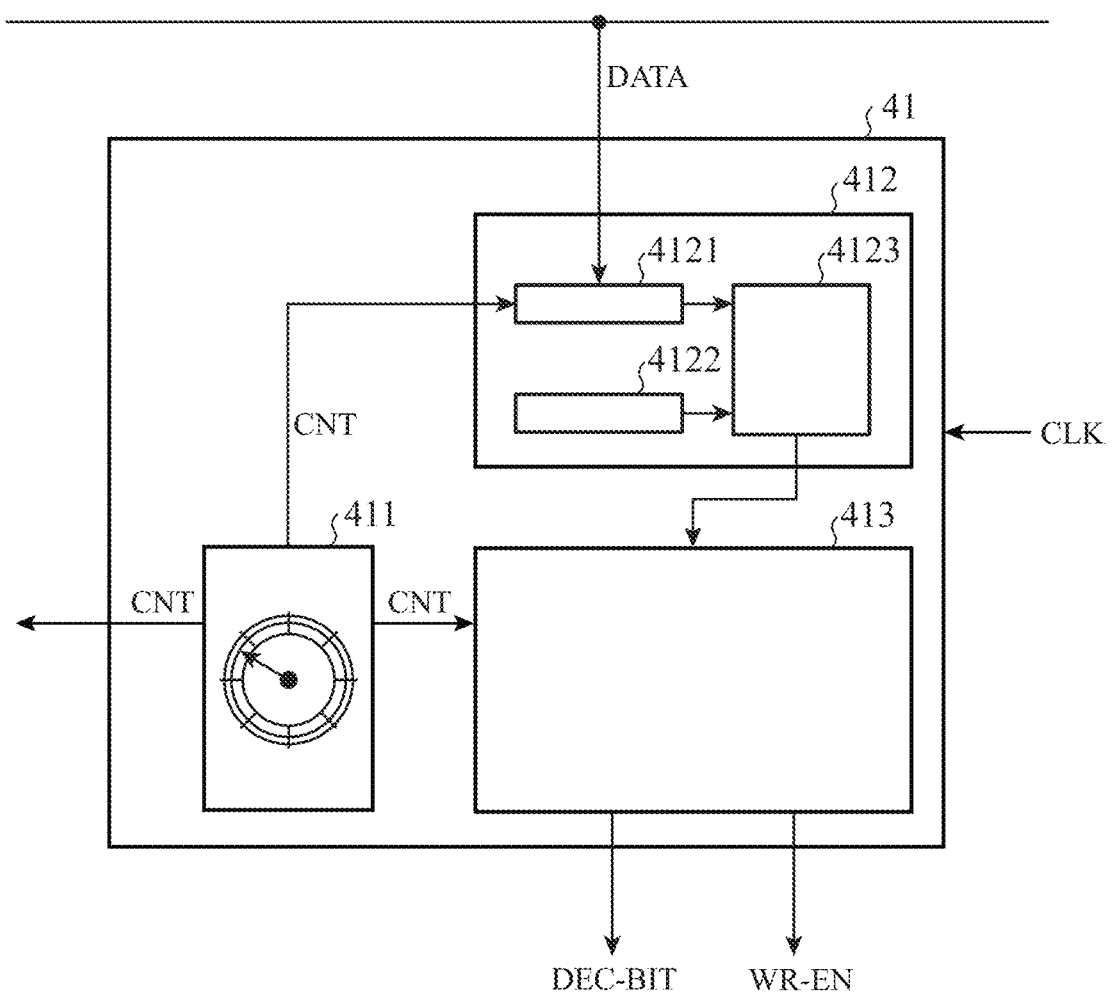
FIG. 3 is a block diagram illustrating a main part of the AD conversion device according to the first embodiment.

As illustrated in FIG. 3, the trigger determination unit 412 includes a 1-data holding unit 4121, a comparison value holding unit 4122, and a data comparison unit 4123.

The 1-data holding unit 4121 temporarily stores the sampling data from the AD converter 3 in time series for every sampling point.

When temporarily storing the sampling data, the 1-data holding unit 4121 stores the sampling data in association with the count value CNT of the counter 411.

The 1-data holding unit 4121 is a register inside a microprocessor (MPU/CPU), and sampling data is sequentially stored therein and read out therefrom one by one in time series in synchronization with the clock signal CLK.

The storage capacity of the register constituting the 1-data holding unit 4121 only needs to be the sum of the number of bits of the sampling data and the number of bits indicating the count value CNT of the counter 411.

The comparison value holding unit 4122 stores a comparison value that is a threshold for determining whether or not the sampling data has a value indicating a high-frequency component.

The comparison value holding unit 4122 is configured by a part of a semiconductor memory which is a ROM.

The data comparison unit 4123 compares the value indicated by the sampling data read from the 1-data holding unit 4121 in synchronization with the clock signal CLK with the comparison value stored in the comparison value holding unit 4122, and gives the sampling point of the sampling data in which the value of the sampling data exceeds the comparison value to the decimation determination unit 413 as a trigger point.

The data comparison unit 4123 monitors a magnitude relationship between the sampling data from the AD converter 3 temporarily stored in the 1-data holding unit 4121 and the comparison value stored in the comparison value holding unit 4122 in real time.

The fact that the value indicated by the sampling data read from the 1-data holding unit 4121 exceeds the comparison value stored in the comparison value holding unit 4122 means that a large amplitude signal is superimposed on an analog signal, and detection of a large amplitude signal can be regarded as generation of an impulsive high-frequency signal.

The trigger point is represented as a count value CNT of the counter 411 associated with the sampling data by the 1-data holding unit 4121.

The data comparison unit 4123 is configured by a microprocessor.

The decimation determination unit 413 sets the reference point of the high-speed sampling region HR as the trigger point detected by the trigger determination unit 412, and determines a selected sampling point for every $N_0$ sampling points among the sampling points in the decimation region DR with the count value CNT from the counter 411.

The decimation determination unit 413 is configured by a microprocessor.

The decimation determination unit 413 sets the pre-trigger sample pulse length S1 and the post-trigger sample pulse length S2 on the basis of the trigger point from the trigger determination unit 412, sets the pulse length S that is the sum of S1 and S2, and then determines the high-speed sampling region HR.

A region other than the high-speed sampling region HR is determined as the decimation region DR.

The decimation determination unit 413 outputs a write-enable signal indicating write-enabled in association with the count value CNT from the counter 411 to the storage unit 5 in synchronization with the clock signal CLK for all sampling points present in the region determined as the high-speed sampling region HR.

At the same time, the decimation determination unit 413 outputs decimation bit information indicating the sampling data of the high-speed sampling region HR in association with the count value CNT from the counter 411 to the storage unit 5 in synchronization with the clock signal CLK.

The decimation determination unit 413 selects one sampling point from $N_0$ sampling points for sampling points present in the region determined as the decimation region DR, and outputs a write-enable signal indicating write-enabled in association with the count value CNT from the counter 411 to the storage unit 5 in synchronization with the clock signal CLK.

In addition, a write-enable signal indicating write-disabled is output to the storage unit 5 in synchronization with the clock signal CLK in association with the count value CNT from the counter 411 for the remaining ($N_0-1$) sampling points.

In the first embodiment, when the count value CNT from the counter 411 is "0" in the decimation region DR, the decimation determination unit 413 outputs, to the storage unit 5, a write-enable signal indicating write-enabled in association with the count value "0", and when the count value CNT is from "$N_0-1$" to "1", the decimation determination unit 413 outputs, to the storage unit 5, a write-enable signal indicating write-disabled in association with each count value.

At the same time, the decimation determination unit 413 outputs decimation bit information indicating sampling data in the decimation region DR in association with the count value CNT from the counter 411 to the storage unit 5 in synchronization with the clock signal CLK.

The buffer memory 42 temporarily stores the sampling data from the AD converter 3 in time series, and the sampling data is read out therefrom in time series.

The buffer memory 42 is a first in, first out (FIFO) memory, stores the sampling data from the AD converter 3 in association with the count value CNT from the counter 411 for every sampling point in synchronization with the clock signal CLK, and the sampling data is read out therefrom in time series.

Figure 4:
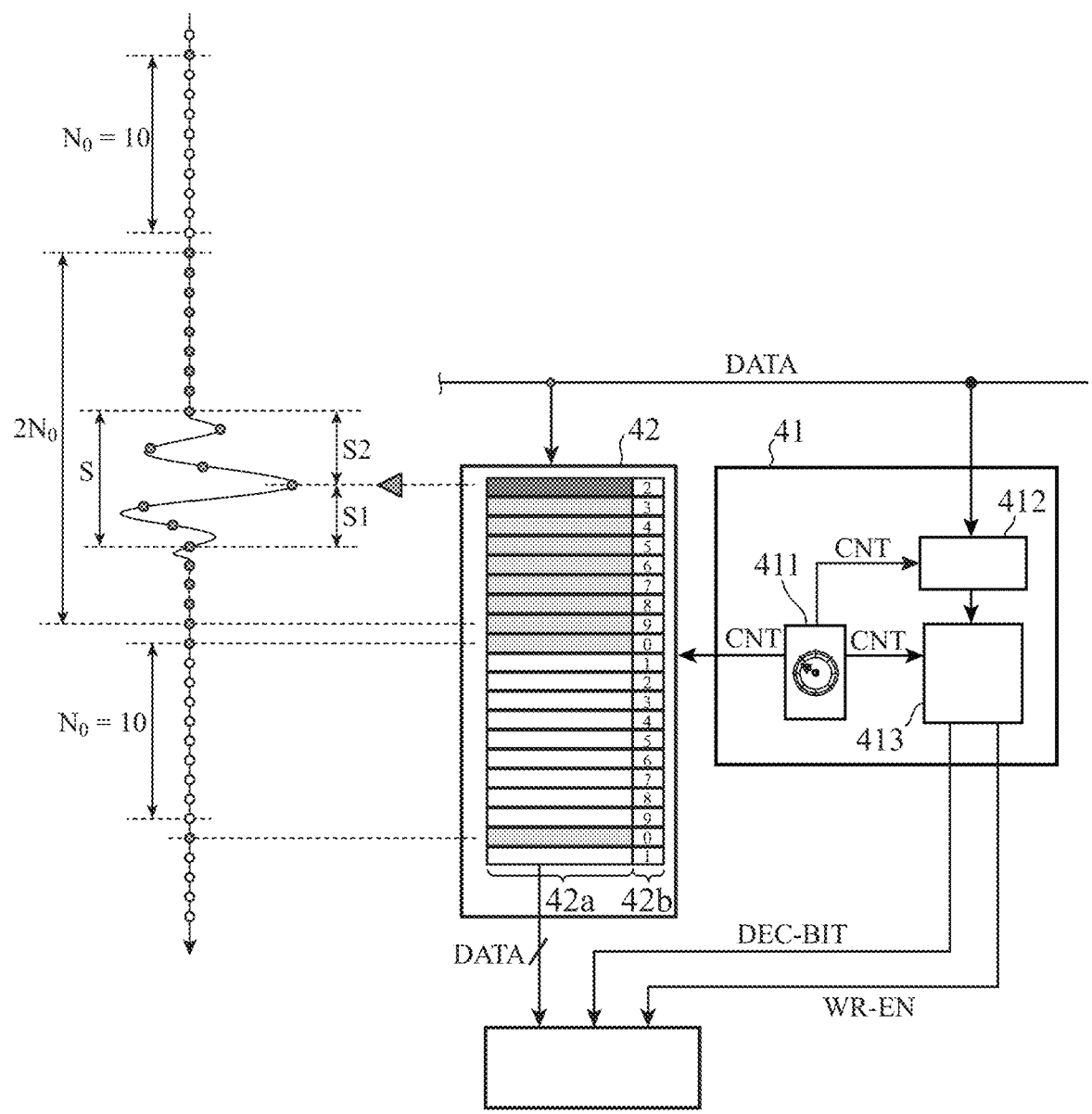
FIG. 4 is a diagram illustrating a relationship between a waveform of an analog input signal, a buffer memory, and a storage unit in the AD conversion device according to the first embodiment.

As illustrated in FIG. 4, the buffer memory 42 has a storage capacity having $2N_0$ data regions each including a data storage region 42a for storing sampling data and a timing storage region 42b for storing the count value CNT for one sampling point.

Since the buffer memory 42 has $2N_0$ storage capacities, it is possible to temporarily store all sampling data for $2N_0$ sampling points in the high-speed sampling region HR determined by the decimation determination unit 413.

Note that, it is enough that the storage capacity of the buffer memory 42 is a capacity having a storage region having at least ($N_0+S1$) data regions.

In the first embodiment, as an example, one data region has a storage capacity of sampling data of 10 bits and a count value CNT of 4 bits.

FIG. 4 illustrates a state in which the sampling data and the count value CNT are stored in the buffer memory 42, the count value CNT indicating "2" at the sampling point which is the trigger point and the sampling data are stored in the first data region, the count value CNT indicating "3" one clock before the count value CNT "2" and the sampling data at the sampling point one clock before the trigger point are stored in the second data region, and the sampling data at the sampling point one clock before and the count value CNT incremented by one are sequentially stored in the third data region to the eighth data region.

The sampling data at the sampling point one clock before the eighth data region and "0" of the count value CNT are stored in the ninth data region, the sampling data at the sampling point one clock before and the count value CNT incremented by one are sequentially stored in the tenth data region to the eighteenth data region, the sampling data at the sampling point one clock before the eighteenth data region and "0" of the count value CNT are stored in the nineteenth data region, and the sampling data at the sampling point one clock before the nineteenth data region and "1" of the count value CNT are stored in the twentieth data region.

In the buffer memory 42, the sampling data and the count value CNT stored in the twentieth data region are read out in synchronization with the clock signal CLK, the sampling data and the count value CNT stored in the first data region to the nineteenth data region are respectively shifted to the previous data regions, and the sampling data at the next sampling point from the AD converter 3 is stored in the first data region.

That is, the buffer memory 42 reads the sampling data from the AD converter 3 in the first data region in synchronization with the clock signal CLK, stores the sampling data in association with the count value CNT from the counter 411 of the sampling point for the read sampling data, shifts the sampling data and the count value CNT stored in the first data region to the $(2N_0-1)$-th data region to the previous data region, and the sampling data and the count value CNT stored in the $2N_0$-th data region are read out.

Since the decimation control unit 41 and the buffer memory 42 are controlled in synchronization with the same clock signal CLK, the timing at which the write-enable signal and the decimation bit information are output from the decimation determination unit 413 in the decimation control unit 41 and the timing at which the sampling data is read out from the buffer memory 42 are the same for the same sampling point.

That is, the count value CNT from the counter 411 associated with the write-enable signal and the decimation bit information output from the decimation determination unit 413 in the decimation control unit 41 is the same as the count value CNT from the counter 411 associated with the sampling data read out from the buffer memory 42.

For example, as illustrated in FIG. 4, when the sampling data output from the AD converter 3 to the first data region of the buffer memory 42 is detected as the trigger point by the trigger determination unit 412, the decimation determination unit 413 sets the sampling data associated from the pre-trigger sample pulse length S1 including the count value CNT "2" from the counter 411 at this time to the count value CNT "9" of the previous stage as the sampling data in the high-speed sampling region HR, and sets the write-enable signal indicating write-enabled for the count value CNT "2" to the count value CNT "9", and therefore, it is recognized that the sampling data stored in the first data region to the eighth region of the buffer memory 42 is stored in the storage unit 5.

In addition, the decimation determination unit 413 also sets the sampling data output from the AD converter 3 and associated with the count values CNT "1", "0", and "9" to "0" including the post-trigger sample pulse length S2 after the count value CNT "2" as the sampling data in the high-speed sampling region HR, and sets the write-enable signal indicating write-enabled, and therefore, it is recognized that the sampling data sequentially stored in the buffer memory 42 in synchronization with the clock signal CLK is also stored in the storage unit 5.

Furthermore, since the decimation determination unit 413 sets the write-enable signal indicating write-enabled for the count value CNT "0" in the decimation region DR, it is recognized that the sampling data for the count value CNT "0" stored in the buffer memory 42 is stored in the storage unit 5.

The storage unit 5 finally stores and saves digital data obtained by digitally converting the analog signal by the AD converter 3.

The storage unit 5 receives the sampling data stored in the buffer memory 42, the write-enable signal and the decimation bit information from the decimation control unit 41, and stores the sampling data stored in the buffer memory 42 at the sampling point at which the write-enable signal indicating write-enabled is received from the decimation control unit 41 and the decimation bit information from the decimation control unit 41 in association with each other.

In synchronization with the clock signal CLK, on the basis of the write-enable signal from the decimation control unit 41 output in synchronization with the clock signal CLK, it is controlled whether or not the storage unit 5 stores the sampling data from the buffer memory 42 read out in synchronization with the clock signal CLK in association with the decimation bit information from the decimation control unit 41 output in synchronization with the clock signal CLK.

That is, the storage unit 5 associates the decimation bit information from the decimation control unit 41 with the sampling data from the buffer memory 42 for the sampling point at which the write-enable signal indicates write-enabled, and stores the sampling data in the storage region.

In the first embodiment, since the decimation determination unit 413 outputs the write-enable signal indicating write-enabled in association with the count value CNT from the counter 411 for all the sampling points present in the region determined as the high-speed sampling region IR, each piece of sampling data from the buffer memory 42 associated with the count value CNT from the counter 411 present in the high-speed sampling region HR is stored in the unit region of the storage region in the storage unit 5 in association with the decimation bit information indicating the sampling data of the high-speed sampling region HR from the decimation control unit 41.

For example, the storage unit 5 stores and saves all the sampling data for a total of $2N_0$ sampling points of $N_0$ pieces of sampling data including the pre-trigger sample pulse length S1 and $N_0$ pieces of sampling data including the post-trigger sample pulse length S2 in the high-speed sampling region HR determined by the decimation determination unit 413.

In addition, since the decimation determination unit 413 outputs the write-enable signal indicating write-enabled in association with the count value CNT from the counter 411 corresponding to one sampling point from the $N_0$ sampling points for the sampling point present in the region determined as the decimation region DR, for example, the count value CNT "0", the sampling data from the buffer memory 42 associated with the count value CNT "0" is stored in the unit region of the storage region in the storage unit 5 in association with the decimation bit information indicating the sampling data of the decimation region DR from the decimation control unit 41.

As illustrated in FIG. 1, the storage region of the storage unit 5 includes a data region 5a and a decimation bit information region 5b, and is defined as a unit region for every sampling data for one sampling point.

In the first embodiment, since the sampling data is 10 bits and the decimation bit information is 1 bit, the storage capacity as a unit region is small.

In addition, since the sampling data in the decimation region DR is stored in the storage region of the storage unit 5 at the decimation rate of $1/N_0$, the storage capacity of the storage unit 5 can be substantially reduced to $1/N_0$ as compared with the case where all the sampling data in the decimation region DR is stored in the storage region of the storage unit 5.

Next, the operation of the AD conversion device 1 that stores the sampling data output from the AD converter 3 in the storage region of the storage unit 5 will be described.

The sampling data from the AD converter 3 output in synchronization with the sampling frequency based on the clock signal CLK is sequentially associated with the count value of the counter 411 output in synchronization with the clock signal CLK and temporarily stored in a first region of the buffer memory 42 in synchronization with the clock signal CLK. The sampling data and the count value CNT temporarily stored in the first region of the buffer memory 42 are sequentially shifted toward the $2N_0$-th data region and to output from the buffer memory 42.

On the other hand, the sampling data from the AD converter 3 output in synchronization with the sampling frequency is sequentially associated with the count value of the counter 411 output in synchronization with the clock signal CLK in synchronization with the clock signal CLK and temporarily stored in the 1-data holding unit 4121 of the trigger determination unit 412.

The value indicated by the sampling data temporarily stored in the 1-data holding unit 4121 is compared with the comparison value that is the threshold stored in the comparison value holding unit 4122 by the data comparison unit 4123, and when the value indicated by the sampling data exceeds the comparison value, the sampling point for the exceeding sampling data is provided to the decimation determination unit 413 together with the counter value as a trigger point.

The decimation determination unit 413 determines a region including $2N_0$ sampling points including the trigger point as the high-speed sampling region HR, and determines a region other than the high-speed sampling region HR as the decimation region DR.

For a counter value indicating a sampling point present in the high-speed sampling region HR, the decimation determination unit 413 outputs a write-enable signal indicating write-enabled and decimation bit information indicating sampling data of the high-speed sampling region HR to the storage unit 5 in synchronization with the clock signal CLK in association with the count value CNT.

Since the write-enable signal and the decimation bit information are output to the storage unit 5 in synchronization with the clock signal CLK, they indicate the same count value as the sampling data from the buffer memory 42 output to the storage unit 5 in synchronization with the clock signal CLK.

As a result, the sampling data for the sampling point present in the high-speed sampling region HR is stored in the storage unit 5 in association with the decimation bit information indicating the sampling data of the high-speed sampling region HR.

On the other hand, for the counter value indicating the sampling point present in the decimation region DR, the decimation determination unit 413 outputs, in association with the count value CNT and in synchronization with the clock signal CLK, a write-enable signal indicating write-enabled in association with one counter value, for example, "0", and a write-enable signal indicating write-disabled in association with the remaining $(N_0-1)$ counter values, together with the decimation bit information indicating the sampling data in the decimation region DR, to the storage unit 5.

Since the write-enable signal and the decimation bit information are output to the storage unit 5 in synchronization with the clock signal CLK, they indicate the same count value as the sampling data from the buffer memory 42 output to the storage unit 5 in synchronization with the clock signal CLK.

As a result, the sampling data for one sampling point present in the decimation region DR is stored in the storage unit 5 in association with the decimation bit information indicating the sampling data in the decimation region DR.

The sampling data for the remaining $(N_0-1)$ sampling points is not stored in the storage unit 5 because the write-enable signal indicates write-disabled.

As a result, all the sampling data present in the high-speed sampling region HR determined by the decimation determination unit 413 and $1/N_0$ (decimation rate) pieces of sampling data present in the decimation region DR determined by the decimation determination unit 413 are stored in the storage unit 5.

That is, all the sampling data present in the high-speed sampling region HR including the impulse signal at the timing when the impulse signal including the high-frequency component is generated is stored in the storage unit 5, and the sampling data present in the decimation region DR at the timing when the impulse signal is not generated is decimated to the decimation rate of $1/N_0$ and stored in the storage unit 5.

As described above, in the AD conversion device 1 according to the first embodiment, the control unit 4 includes the buffer memory 42 in which the sampling data from the AD converter 3 is temporarily stored in time series and from which the sampling data is read out in time series, the decimation control unit 41 in the control unit 4 monitors whether or not the analog signal contains a high-frequency component, when the analog signal contains the high-frequency component, uses a sampling point in the sampling data from the AD converter 3, containing the high-frequency component, as a reference point, sets a region having a plurality of sampling points including the reference point and sampling points before and after the reference point, as a high-speed sampling region HR, sets a region other than the high-speed sampling region HR as a decimation region DR in which sampling is performed at a decimation rate of $1/N_0$ for selecting one sampling point from $N_0$ sampling points, outputs a write-enable signal indicating write-enabled for the sampling data at the selected sampling point for every $N_0$ sampling points among the sampling points in the decimation region DR and the sampling data at all sampling points in the high-speed sampling region HR, and outputs decimation bit information indicating whether the sampling data is sampling data at a sampling point in the decimation region DR or sampling data at a sampling point in the high-speed sampling region HR. The storage unit 5 receives the sampling data stored in the buffer memory 42 and the write-enable signal and the decimation bit information from the decimation control unit 41, and stores the sampling data stored in the buffer memory 42 and the decimation bit information from the decimation control unit 41 in association with each other at the sampling point at which the write-enable signal indicating write-enabled is received from the decimation control unit 41. Therefore, the storage capacity of the storage unit 5, that is, the memory size can be reduced to substantially $1/N_0$ with respect to the memory size of the storage unit 5 that stores all the sampling data from the AD converter 3.

In observing the analog signal input to the AD converter 3, in a case where the frequency of generation of the impulse signal in the analog signal is low, storage and saving in the storage unit 5 are decimated to $1/N_0$ for many periods, and the memory size reduction effect of the storage unit 5 is large.

In particular, the buffer memory 42 temporarily stores the sampling data from the AD converter 3 in time series, reads the sampling data in time series, and the decimation control unit 41 monitors whether or not the analog signal contains a high-frequency component in real time, and stores the decimation bit information in the storage unit 5 in association with the sampling data. Therefore, the sampling data can be managed by, for example, 1-bit decimation bit information having a very small capacity for storage in the storage unit 5.

In addition, since all the sampling data from the AD converter 3 is temporarily stored in the buffer memory 42 in time series, even if the impulse signal is asynchronously generated in the analog signal input to the AD converter 3, the sampling data for the sample point on the time axis is not missed, and the sampling data present in the decimation region DR can be stored in the storage unit 5 at the decimation rate of $1/N_0$ by clearly distinguishing the high-speed sampling region HR and the decimation region DR.

In addition, since the sampling data in the decimation control unit 41 and the buffer memory 42 is made to correspond to the count value from the counter 411 that operates with the $N_0$ as the upper limit value of the count value, management of the absolute time for the sampling data stored in the storage unit 5 can be made unnecessary.

The decimation control unit 41 includes the 1-data holding unit 4121 that temporarily stores the sampling data from the AD converter 3 in time series for every sampling point, compares the sampling data temporarily stored in the 1-data holding unit 4121 with the comparison value stored in the comparison value holding unit 4122 by the data comparison unit 4123, and uses the sampling point of the sampling data in which the value of the sampling data exceeds the comparison value as the trigger point, so that the high-frequency signal can be efficiently detected.

Second Embodiment

An AD conversion device 1 according to a second embodiment will be described with reference to FIGS. 5 and 6.

The AD conversion device 1 according to the second embodiment is different from the AD conversion device 1 according to the first embodiment only in the configuration of the trigger determination unit 412, and is the same as the AD conversion device 1 according to the first embodiment in other points.

Figure 5:
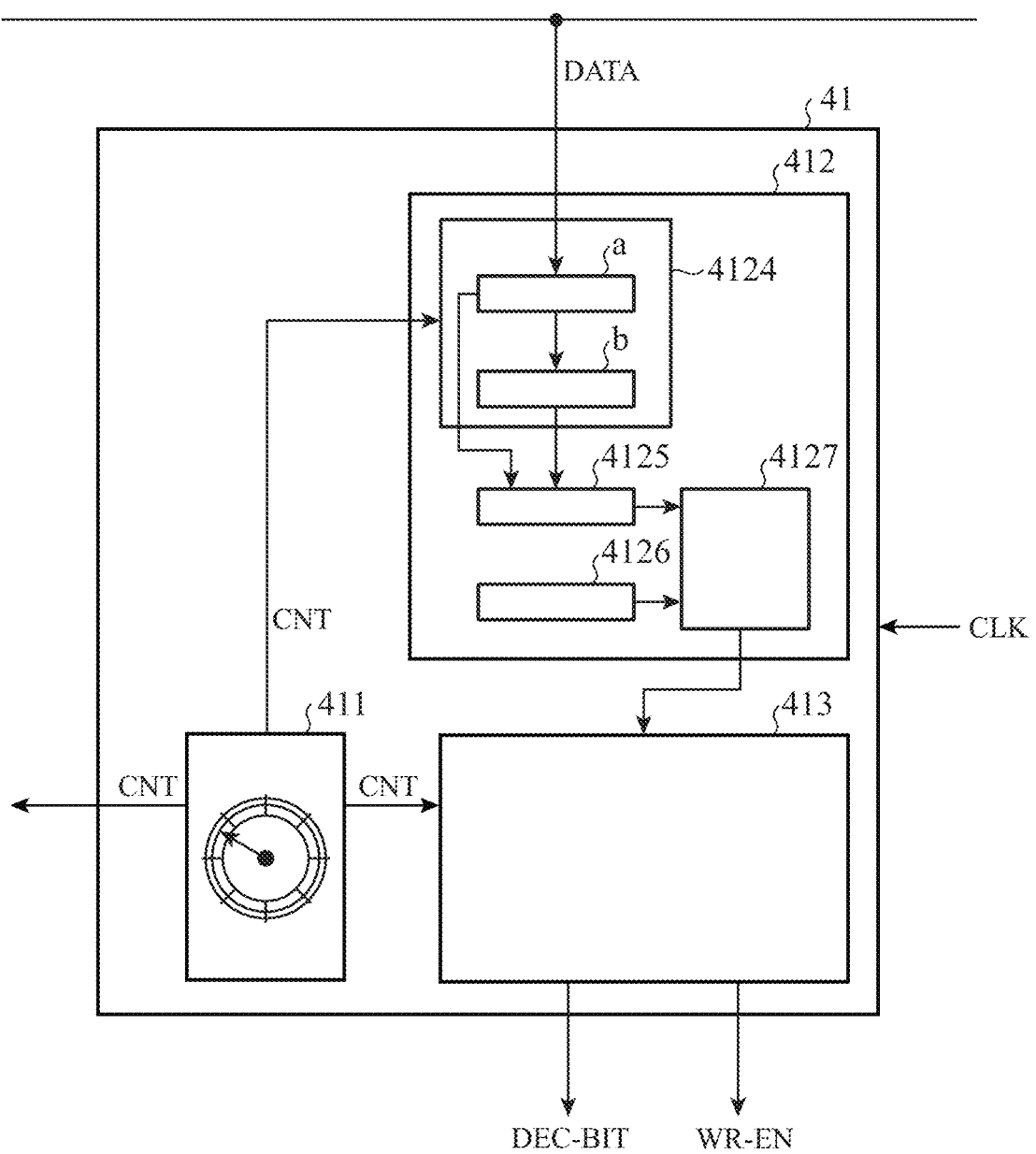
FIG. 5 is a block diagram illustrating a main part of an AD conversion device according to a second embodiment.
Figure 6:
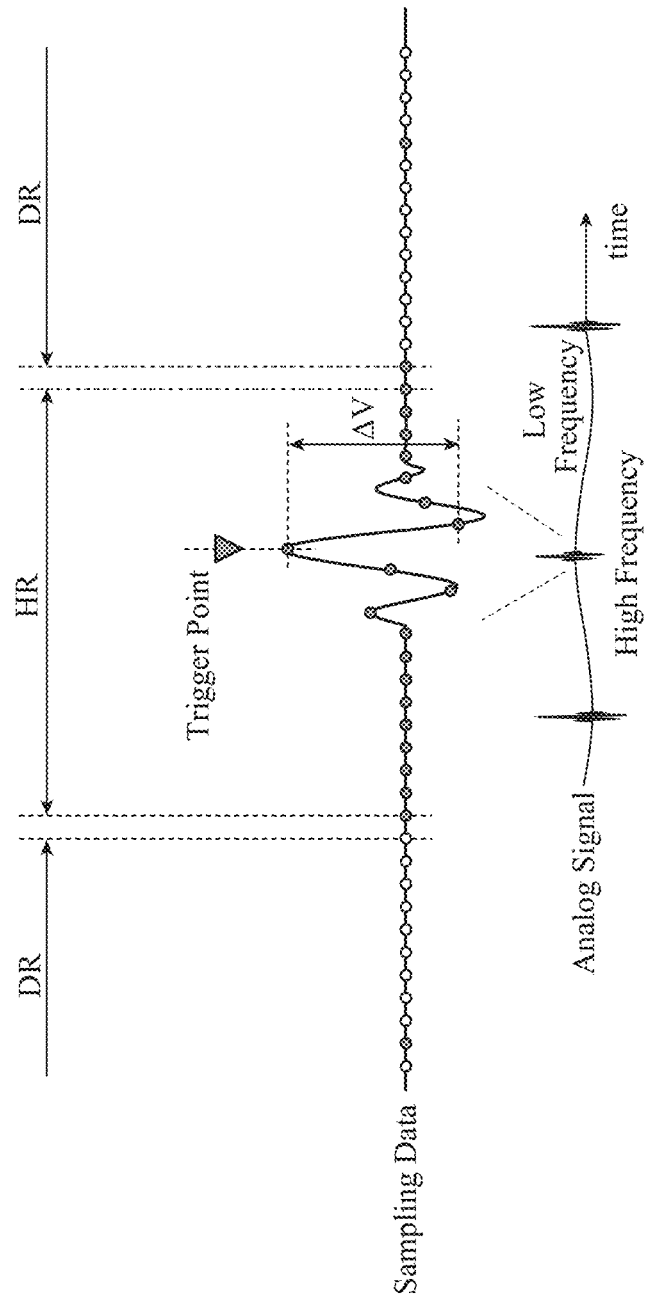
FIG. 6 is a diagram illustrating a relationship between a waveform of an analog input signal and sample points in the AD conversion device according to the second embodiment.

Note that in FIGS. 5 and 6, the same reference numerals as those in FIGS. 1 to 4 denote the same or corresponding parts.

While the trigger determination unit 412 in the AD conversion device 1 according to the first embodiment compares the sampling data temporarily stored in the 1-data holding unit 4121 with the comparison value stored in the comparison value holding unit 4122 by the data comparison unit 4123 and uses the sampling point of the sampling data in which the value of the sampling data exceeds the comparison value as the trigger point, the trigger determination unit 412 in the AD conversion device 1 according to the second embodiment includes the 2-data holding unit 4124, the difference calculation unit 4125, the difference comparison value holding unit 4126, and the data difference comparison unit 4127, calculates the difference between the values of the two pieces of sampling data temporarily stored in the 2-data holding unit 4124 by the difference calculation unit 4125, and compares the value of the difference calculated by the difference calculation unit 4125 with the difference comparison value stored in the difference comparison value holding unit 4126 by the data difference comparison unit 4127, and sets the sampling point of the sampling data in which the value of the calculated difference exceeds the difference comparison value as the trigger point.

The 2-data holding unit 4124 temporarily stores the sampling data from the AD converter 3 for every adjacent, that is, two successive sampling points in time series.

When temporarily storing each of the two pieces of sampling data, the 2-data holding unit 4124 stores the sampling data in association with the count value CNT of the counter 411.

The 2-data holding unit 4124 is a register inside a microprocessor (MPU/CPU), and has a first region a and a second region b.

The 2-data holding unit 4124 sequentially stores and reads the sampling data one by one in time series in association with the count value CNT of the counter 411 in synchronization with the clock signal CLK in the first region a, and the sampling data associated with the count value CNT and temporarily stored in the first region a is shifted to the second region b in synchronization with the clock signal CLK, and the sampling data associated with the count value CNT and temporarily stored in the shifted second region b is read out.

Each of the storage capacities of the first region a and the second region b in the register constituting the 2-data holding unit 4124 only needs to be the sum of the number of bits of the sampling data and the number of bits indicating the count value CNT of the counter 411.

The difference calculation unit 4125 calculates a difference between the values of the two pieces of sampling data temporarily stored in the 2-data holding unit 4124.

The difference calculation unit 4125 is a subtraction unit that subtracts the value of the sampling data stored in the second region b from the value of the sampling data stored in the first region a of the 2-data holding unit 4124, and outputs an absolute value of the subtracted value.

The difference comparison value holding unit 4126 stores a difference comparison value that is a threshold of a difference between values of sampling data for two adjacent sampling points for determining whether or not the sampling data is a value indicating a high-frequency component.

The difference comparison value holding unit 4126 is configured by a part of a semiconductor memory which is a ROM.

The data difference comparison unit 4127 compares the absolute value of the difference calculated by the difference calculation unit 4125 with the difference comparison value stored in the difference comparison value holding unit 4126 in synchronization with the clock signal CLK, and when the absolute value of the calculated difference exceeds the difference comparison value, gives a sampling point at which the difference between the values of two adjacent pieces of sampling data temporarily stored in the first region a and the second region b is large, that is, the change amount is large to the decimation determination unit 413 as a trigger point.

The data difference comparison unit 4127 monitors a magnitude relationship between the absolute value of the difference calculated by the difference calculation unit 4125 and the difference comparison value stored in the difference comparison value holding unit 4126 in real time.

The fact that the absolute value of the difference calculated by the difference calculation unit 4125 exceeds the difference comparison value stored in the difference comparison value holding unit 4126 means that the difference between the values of the two adjacent pieces of sampling data temporarily stored in the first region a and the second region b is large, in other words, a signal having a steep time variation is superimposed on the analog signal between the adjacent sampling data, and detection of this can be regarded as generation of the impulsive high-frequency signal.

The trigger point is a count value CNT of the counter 411 associated with sampling data having a large value stored by the 2-data holding unit 4124.

The difference calculation unit 4125 and the data difference comparison unit 4127 are configured by a microprocessor.

The AD conversion device 1 according to the second embodiment configured as described above also has effects similar to those of the AD conversion device 1 according to the first embodiment.

That is, since the trigger detection is performed on the condition that the difference between the values of two adjacent pieces of sampling data is larger than a specified value, it is possible to efficiently extract the high-frequency signal with a steep time change, and to reduce the storage capacity of the storage unit 5 with respect to the sampling data.

Furthermore, even in a case where the signal amplitude of the analog signal to be observed is small, the AD conversion device 1 according to the second embodiment can extract the analog signal to be observed as a signal containing a high-frequency component if the time change of the analog signal to be observed is steep. Therefore, it is possible to prevent missing of the analog signal to be observed.

Third Embodiment

An AD conversion device 1 according to a third embodiment will be described with reference to FIGS. 7 and 8.

The AD conversion device 1 according to the third embodiment is different from the AD conversion device 1 according to the first embodiment only in the configuration of the decimation determination unit 413, and is the same as the AD conversion device 1 according to the first embodiment in other points.

Figure 7:
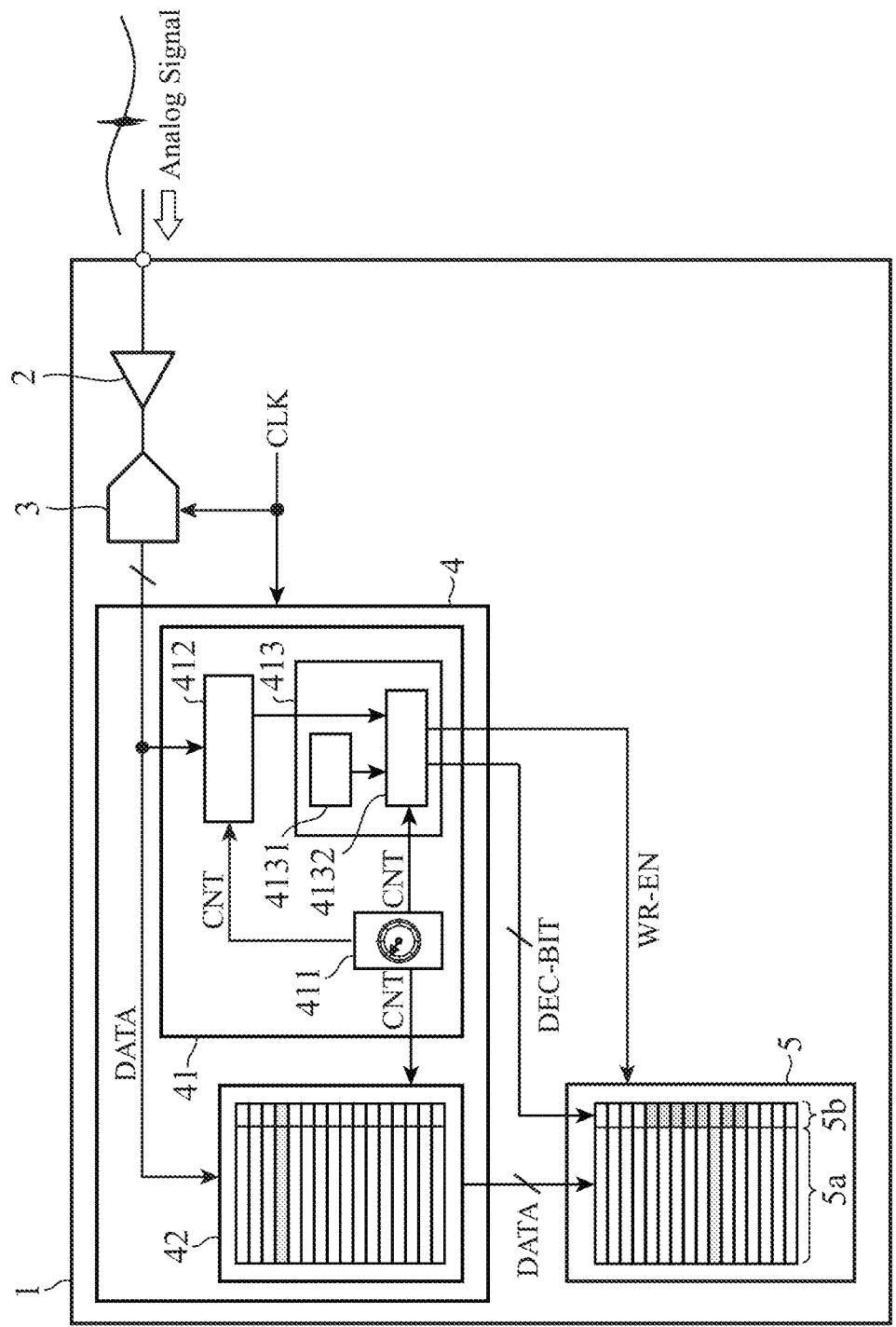
FIG. 7 is a block diagram illustrating an AD conversion device according to a third embodiment.
Figure 8:
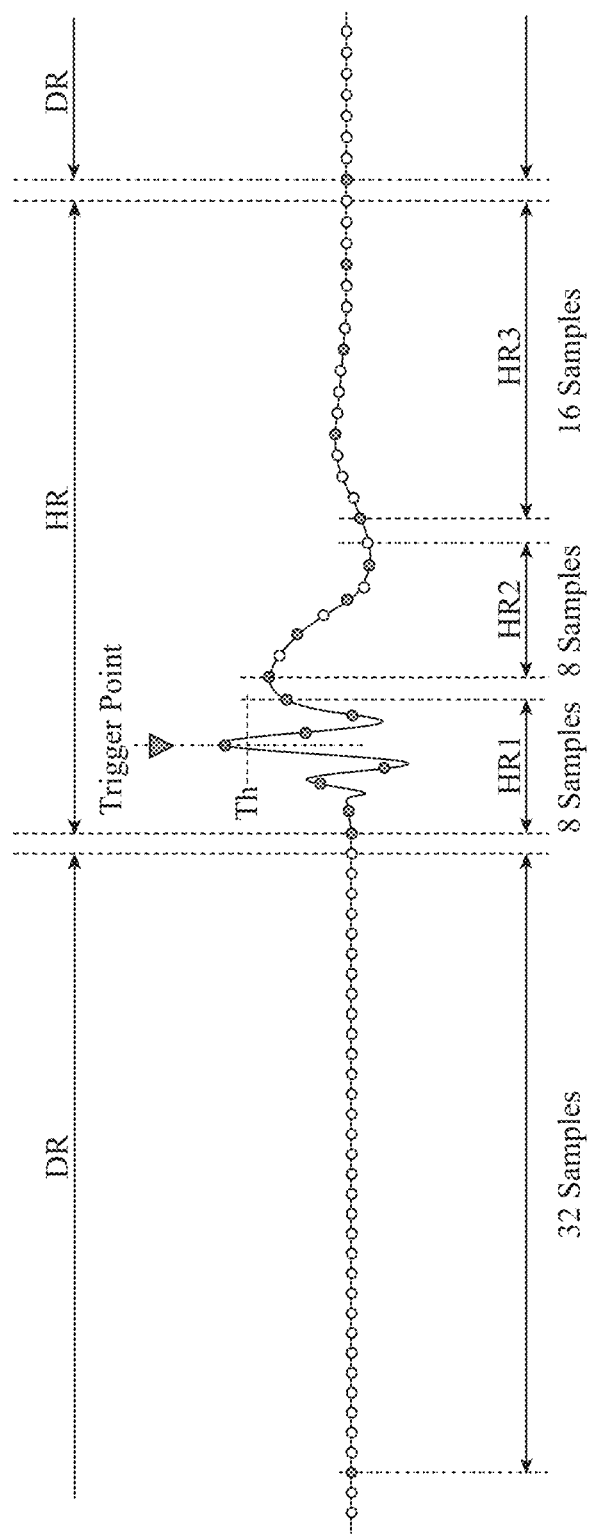
FIG. 8 is a diagram illustrating a relationship between a waveform of an analog input signal and sample points in the AD conversion device according to the third embodiment.

In FIGS. 7 and 8, the same reference numerals as those in FIGS. 1 to 4 denote the same or corresponding parts.

The AD conversion device 1 according to the third embodiment is effective when a high-frequency signal superimposed on an analog signal input to the AD converter 3 has a known waveform shape, such as an impulsive high-frequency signal represented by electrostatic discharge noise.

A waveform shape of an impulsive high-frequency signal represented by electrostatic discharge noise is generally a waveform shape in which a very steep impulsive peak occurs at a detected trigger point and then a gradual amplitude fluctuation continues.

While the decimation determination unit 413 in the AD conversion device 1 according to the first embodiment outputs a write-enable signal indicating write-enabled for all the sampling data present in the high-speed sampling region HR, the decimation determination unit 413 in the AD conversion device 1 according to the third embodiment includes a decimation setting unit 4131 and a memory control unit 4132, the decimation setting unit 4131 has a plurality of decimation rates, the memory control unit 4132 determines the high-speed sampling region HR and the decimation region DR, and further divides the high-speed sampling region HR into a plurality of regions, and outputs a write-enable signal indicating write-enabled for all the sampling data present in the first region HR1 of the high-speed sampling region HR, and sampling is performed at a decimation rate of $1/N_1$ or the like larger than the decimation rate $1/N_0$ for the decimation region DR on the remaining region HR2 or the like, and a write-enable signal indicating write-enabled is output to sampling data at the selected sampling point for every $N_1$ or the like sampling points, the $N_1$ having a value smaller than the $N_0$, among the sampling points in the remaining region HR2 or the like.

In the AD conversion device 1 according to the third embodiment, as illustrated in FIG. 8, a high-speed sampling region HR and a decimation region DR are determined, and the high-speed sampling region HR is divided into a first region HR1 to a third region HR3.

The first region HR1 in the high-speed sampling region HR is a region including a reference point and having a decimation rate of 1, that is, a region without decimation, the second region HR2 is a region continuous with the first region HR1 and sampled at a decimation rate of $1/N_1$ for selecting one sampling point from $N_1$ sampling points, the $N_1$ having a value smaller than $N_0$, and the third region HR3 is a region continuous with the second region HR2 and sampled at a decimation rate of $1/N_2$ for selecting one sampling point from $N_2$ sampling points, the $N_2$ having a value smaller than $N_0$ and larger than $N_1$.

The decimation control unit 41 outputs a write-enable signal indicating write-enabled for the sampling data at all the sampling points in the first region HR1, the sampling data at the selected sampling point for every $N_1$ sampling points among the sampling points in the second region HR2, and the sampling data at the selected sampling point for every $N_2$ sampling points among the sampling points in the third region HR3.

The decimation control unit 41 includes the counter 411, the trigger determination unit 412, and the decimation determination unit 413.

The decimation determination unit 413 includes the decimation setting unit 4131 and the memory control unit 4132.

The decimation setting unit 4131 is an interface through which a user sets parameters related to decimation storage in the storage unit 5, and as an example, four types of parameters, that is, no decimation (code 00) and a pulse length s1 for the first region HR1 of the high-speed sampling region HR, a decimation rate of $1/N_1$ (code 01) and a pulse length s2 for the second region HR2, a decimation rate of $1/N_2$ (code 10) and a pulse length s3 for the third region HR3, and a decimation rate of $1/N_0$ (code 11) for the decimation region DR are set and stored.

As an example, assuming that $N_0$ is 32, $N_1$ is 2, and $N_2$ is 4, the decimation rates are 1/32, 1/2, and 1/4, s1 corresponds to the length of eight samples for eight sampling points, s2 corresponds to the length of eight samples for eight sampling points, s3 corresponds to the length of 16 samples for 16 sampling points, and s1+s2+s3 is $N_0$.

The memory control unit 4132 sets the reference point of the high-speed sampling region HR as the trigger point detected by the trigger determination unit 412, sets the first region HR1 having the pulse length s1 including the trigger point with reference to the trigger point, the second region HR2 having the pulse length s2, and the third region HR3 having the pulse length s3 on the basis of the parameter set by the decimation setting unit 4131, and determines a region other than the high-speed sampling region HR as the decimation region DR.

The memory control unit 4132 is configured by a microprocessor.

In addition, the memory control unit 4132 determines, by the count value CNT from the counter 411, the selected sampling point for every $N_1$ sampling points among the sampling points in the second region HR2, the selected sampling point for every $N_2$ sampling points among the sampling points in the third region HR3, and the selected sampling point for every $N_0$ sampling points among the sampling points in the decimation region DR.

The memory control unit 4132 outputs a write-enable signal indicating write-enabled in association with the count value CNT from the counter 411 to the storage unit 5 in synchronization with the clock signal CLK for all sampling points present in the region determined as the first region HR1.

At the same time, the memory control unit 4132 outputs decimation bit information indicating the sampling data of the first region HR1 in association with the count value CNT from the counter 411 to the storage unit 5 in synchronization with the clock signal CLK.

The decimation bit information at this time is 2-bit information of a code "00" indicating the first region HR1 of the high-speed sampling region HR.

The memory control unit 4132 selects one sampling point from among the $N_1$ sampling points for the sampling points present in the region determined as the second region HR2, and outputs the write-enable signal indicating write-enabled in association with the count value CNT from the counter 411 to the storage unit 5 in synchronization with the clock signal CLK.

In addition, a write-enable signal indicating write-disabled is output to the storage unit 5 in synchronization with the clock signal CLK in association with the count value CNT from the counter 411 for the remaining ($N_1-1$) sampling points.

At the same time, the memory control unit 4132 outputs decimation bit information indicating the sampling data of the second region HR2 in association with the count value CNT from the counter 411 to the storage unit 5 in synchronization with the clock signal CLK.

The decimation bit information at this time is 2-bit information of a code "01" indicating the second region HR2 of the high-speed sampling region HR.

The memory control unit 4132 selects one sampling point from the $N_2$ sampling points for the sampling points present in the region determined as the third region HR3, and outputs a write-enable signal indicating write-enabled in association with the count value CNT from the counter 411 to the storage unit 5 in synchronization with the clock signal CLK.

In addition, a write-enable signal indicating write-disabled is output to the storage unit 5 in synchronization with the clock signal CLK in association with the count value CNT from the counter 411 for the remaining ($N_2-1$) sampling points.

At the same time, the memory control unit 4132 outputs decimation bit information indicating the sampling data of the third region HR3 in association with the count value CNT from the counter 411 to the storage unit 5 in synchronization with the clock signal CLK.

The decimation bit information at this time is 2-bit information of a code "10" indicating the third region HR3 of the high-speed sampling region HR.

The memory control unit 4132 selects one sampling point from $N_0$ sampling points for the sampling points present in the region determined as the decimation region DR, and outputs a write-enable signal indicating write-enabled in association with the count value CNT from the counter 411 to the storage unit 5 in synchronization with the clock signal CLK.

In addition, a write-enable signal indicating write-disabled is output to the storage unit 5 in synchronization with the clock signal CLK in association with the count value CNT from the counter 411 for the remaining ($N_0-1$) sampling points.

At the same time, the decimation determination unit 413 outputs decimation bit information indicating sampling data in the decimation region DR in association with the count value CNT from the counter 411 to the storage unit 5 in synchronization with the clock signal CLK.

The decimation bit information at this time is 2-bit information of a code "11" indicating the decimation region DR.

Next, the operation of the AD conversion device 1 that stores the sampling data output from the AD converter 3 in the storage region of the storage unit 5 will be described.

The sampling data from the AD converter 3 output in synchronization with the sampling frequency based on the clock signal CLK is associated with the count value of the counter 411 output in synchronization with the clock signal CLK in synchronization with the clock signal CLK, and is sequentially temporarily stored from the first region to the $2N_0$-th data region of the buffer memory 42, similarly to the AD conversion device 1 according to the first embodiment.

On the other hand, similarly to the AD conversion device 1 according to the first embodiment, the sampling data from the AD converter 3 output in synchronization with the sampling frequency is input to the trigger determination unit 412, the sampling data is monitored in real time, and the detected trigger point is provided to the decimation determination unit 413 together with the counter value.

The memory control unit 4132 in the decimation determination unit 413 determines a region including $N_0$ sampling points including the trigger point as the high-speed sampling region HR, and determines a region other than high-speed sampling region HR as the decimation region DR.

The memory control unit 4132 also determines the first region HR1 to the third region HR3 in the high-speed sampling region HR.

For a counter value indicating a sampling point present in the first region HR1 of the high-speed sampling region HR, the memory control unit 4132 outputs a write-enable signal indicating write-enabled and decimation bit information indicating sampling data of the first region HR1 to the storage unit 5 in synchronization with the clock signal CLK in association with the count value CNT.

Since the write-enable signal and the decimation bit information are output to the storage unit 5 in synchronization with the clock signal CLK, they indicate the same count value as the sampling data from the buffer memory 42 output to the storage unit 5 in synchronization with the clock signal CLK.

As a result, the sampling data for the sampling point present in the first region HR1 of the high-speed sampling region HR is stored in the storage unit 5 in association with the decimation bit information indicating the sampling data of the first region HR1.

For the counter value indicating the sampling point present in the second region HR2, the memory control unit 4132 outputs, in association with the count value CNT and in synchronization with the clock signal CLK, the write-enable signal indicating write-enabled in association with the counter value for every $N_1$ counter values and the write-enable signal indicating write-disabled in association with the remaining ($N_1-1$) counter values, together with the decimation bit information indicating the sampling data in the second region HR2, to the storage unit 5.

Since the write-enable signal and the decimation bit information are output to the storage unit 5 in synchronization with the clock signal CLK, they indicate the same count value as the sampling data from the buffer memory 42 output to the storage unit 5 in synchronization with the clock signal CLK.

As a result, the sampling data for the sampling point for every $N_1$ sampling points present in the second region HR2 is stored in the storage unit 5 in association with the decimation bit information indicating the sampling data of the second region HR2.

The sampling data for the remaining ($N_1-1$) sampling points is not stored in the storage unit 5 because the write-enable signal indicates write-disabled.

For the counter value indicating the sampling point present in the third region HR3, the memory control unit 4132 outputs, in association with the count value CNT and in synchronization with the clock signal CLK, the write-enable signal indicating write-enabled in association with the counter value for every $N_2$ counter values and the write-enable signal indicating write-disabled in association with the remaining ($N_2-1$) counter values, together with the decimation bit information indicating the sampling data in the third region HR3, to the storage unit 5.

Since the write-enable signal and the decimation bit information are output to the storage unit 5 in synchronization with the clock signal CLK, they indicate the same count value as the sampling data from the buffer memory 42 output to the storage unit 5 in synchronization with the clock signal CLK.

As a result, the sampling data for the sampling point for every $N_2$ sampling points present in the third region HR3 is stored in the storage unit 5 in association with the decimation bit information indicating the sampling data of the third region HR3.

The sampling data for the remaining ($N_2-1$) sampling points is not stored in the storage unit 5 because the write-enable signal indicates write-disabled.

On the other hand, for the counter value indicating the sampling point present in the decimation region DR, the memory control unit 4132 outputs, in association with the count value CNT and in synchronization with the clock signal CLK, the write-enable signal indicating write-enabled in association with the counter value for every $N_0$ counter values and the write-enable signal indicating write-disabled in association with the remaining ($N_0-1$) counter values, together with the decimation bit information indicating the sampling data in the decimation region DR, to the storage unit 5.

Since the write-enable signal and the decimation bit information are output to the storage unit 5 in synchronization with the clock signal CLK, they indicate the same count value as the sampling data from the buffer memory 42 output to the storage unit 5 in synchronization with the clock signal CLK.

As a result, the sampling data for the sampling point for every $N_0$ sampling points present in the decimation region DR is stored in the storage unit 5 in association with the decimation bit information indicating the sampling data in the decimation region DR.

The sampling data for the remaining ($N_0-1$) sampling points is not stored in the storage unit 5 because the write-enable signal indicates write-disabled.

As a result, the storage unit 5 stores all the sampling data present in the first region HR1 of the high-speed sampling region HR determined by the memory control unit 4132, $1/N_1$ (decimation rate) pieces of sampling data present in the second region HR2 determined by the memory control unit 4132, $1/N_2$ (decimation rate) pieces of sampling data present in the third region HR3 determined by the memory control unit 4132, and $1/N_0$ (decimation rate) pieces of sampling data present in the decimation region DR determined by the memory control unit 4132.

That is, all the sampling data present in the first region HR1 including a steep waveform at the timing when the steep waveform of the impulse signal is generated is stored in the storage unit 5, the sampling data present in the second region HR2 and the third region HR3 which are timings when the waveform of the impulse signal is gentle is decimated to decimation rates of $1/N_1$ and $1/N_2$, and the sampling data present in the decimation region DR which is the timing when the impulse signal is not generated is decimated to decimation rate of $1/N_0$ and stored in the storage unit 5.

The AD conversion device 1 according to the third embodiment configured as described above also has effects similar to those of the AD conversion device 1 according to the first embodiment.

Moreover, since the AD conversion device 1 according to the third embodiment can set a plurality of decimation rates even in the high-speed sampling region HR in accordance with the waveform shape of the impulse signal, the storage capacity of the storage unit 5 for the sampling data present in the high-speed sampling region HR can be reduced.

Note that the configuration of the trigger determination unit 412 in the AD conversion device 1 according to the third embodiment may be changed to the configuration of the trigger determination unit 412 in the AD conversion device 1 according to the second embodiment.

Fourth Embodiment

An AD conversion device 1 according to a fourth embodiment will be described with reference to FIGS. 9 to 11.

The AD conversion device 1 according to the fourth embodiment is different from the AD conversion device 1 according to the first embodiment only in the configuration of the trigger determination unit, and is the same as the AD conversion device 1 according to the first embodiment in other points.

Figure 9:
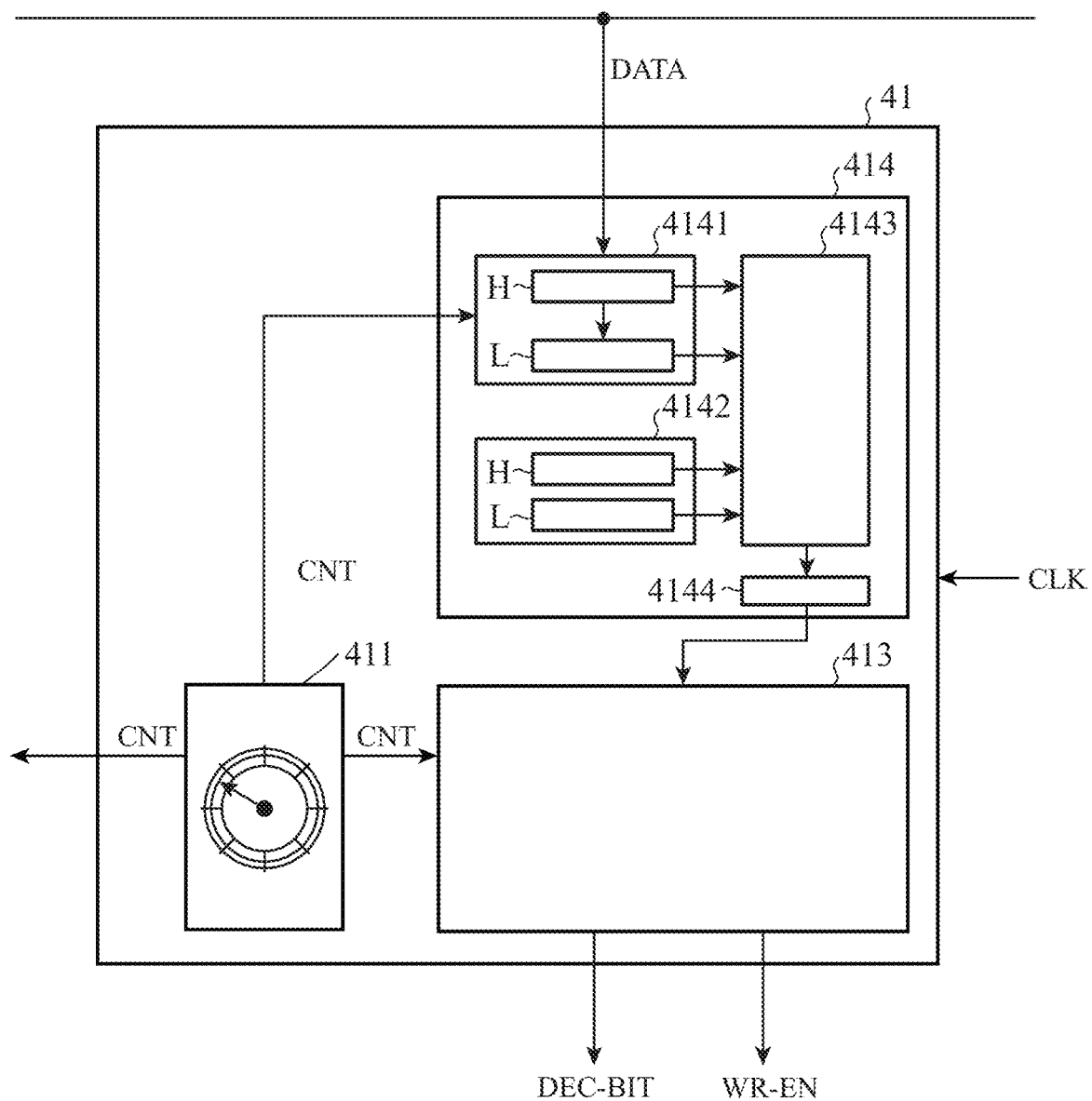
FIG. 9 is a block diagram illustrating a main part of an AD conversion device according to a fourth embodiment.
Figure 10:
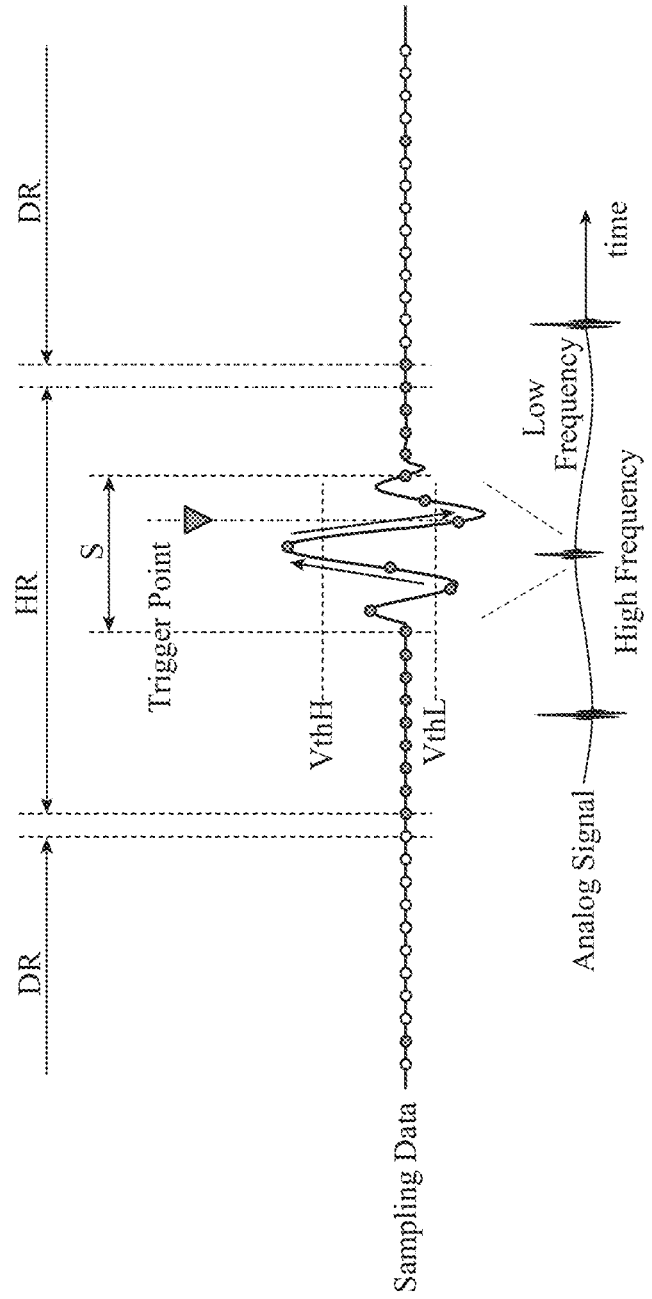
FIG. 10 is a diagram illustrating a relationship between a waveform of an analog input signal and sample points in the AD conversion device according to the fourth embodiment.
Figure 11:
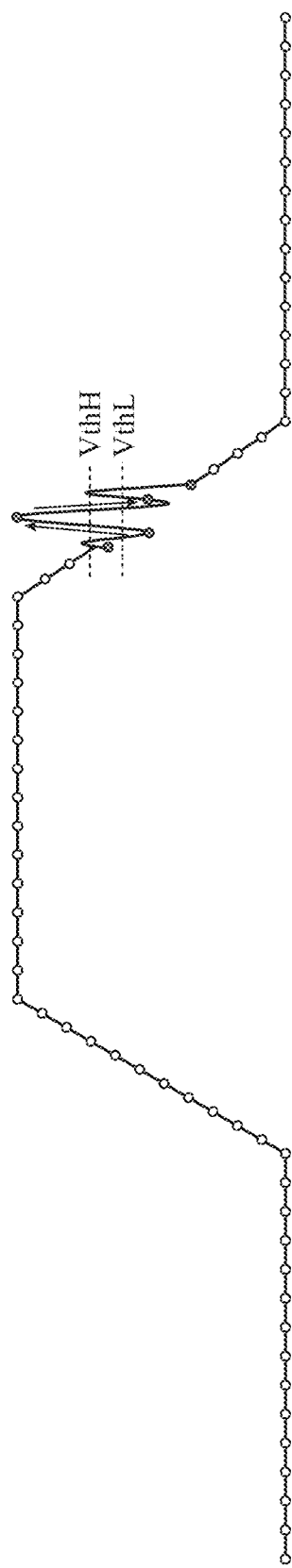
FIG. 11 is a diagram illustrating a waveform in which noise is superimposed on a falling portion of a rectangular wave in an input signal together with sample points in the AD conversion device according to the fourth embodiment.

Note that in FIGS. 9 to 11, the same reference numerals as those in FIGS. 1 to 4 denote the same or corresponding parts.

While the trigger determination unit 412 in the AD conversion device 1 according to the first embodiment compares the sampling data temporarily stored in the 1-data holding unit 4121 with the comparison value stored in the comparison value holding unit 4122 by the data comparison unit 4123 and uses the sampling point of the sampling data at which the value of the sampling data exceeds the comparison value as the trigger point, the trigger determination unit 414 in the AD conversion device 1 according to the fourth embodiment includes a data holding unit 4141, a comparison value holding unit 4142, a data comparison unit 4143, and a trigger point extracting unit 4144, and the data comparison unit 4143 compares the value indicated by the sampling data temporarily stored in the data holding unit 4141 with a first comparison value VthH and a second comparison value VthL stored in the comparison value holding unit 4142, and sets the sampling point of the sampling data in which the value of the compared sampling data exceeds the first comparison value VthH as a high-side sampling point, sets the sampling point of the sampling data in which the value of the compared sampling data is less than the second comparison value VthL as a low-side sampling point, and when the data comparison unit 4143 extracts both the high-side sampling point and the low-side sampling point at the sampling points of the set number of successive sampling points, the trigger point extracting unit 4144 sets one of the extracted sampling points of the high-side sampling point and the low-side sampling point as the trigger point.

Therefore, the trigger determination unit 414 will be mainly described.

The data holding unit 4141 is a 2-data holding unit that temporarily stores the sampling data from the AD converter 3 for every adjacent, that is, two successive sampling points in time series.

When temporarily storing each of the two pieces of sampling data, the data holding unit 4141 stores the sampling data in association with the count value CNT of the counter 411.

The data holding unit 4141 is a register inside the microprocessor and has a first region H and a second region L.

The data holding unit 4141 sequentially stores and reads the sampling data in and from the first region H one by one in time series in association with the count value CNT of the counter 411 in synchronization with the clock signal CLK, and the sampling data associated with the count value CNT temporarily stored in the first region H is shifted to the second region L in synchronization with the clock signal CLK, and the sampling data associated with the count value CNT temporarily stored in the shifted second region L is read out.

Each of the storage capacities of the first region H and the second region L in the register constituting the data holding unit 4141 only needs to be the sum of the number of bits of the sampling data and the number of bits indicating the count value CNT of the counter 411.

The sampling data temporarily stored in the first region H in the data holding unit 4141 is compared with the first comparison value VthH stored in the first region H in the comparison value holding unit 4142 by the data comparison unit 4143.

The sampling data temporarily stored in the second region L in the data holding unit 4141 is compared with the second comparison value VthL stored in the second region L in the comparison value holding unit 4142 by the data comparison unit 4143.

The comparison value holding unit 4142 is a 2-data holding unit that has the first region H and the second region L, stores the first comparison value VthH, which is a threshold on a "high" side for determining whether or not sampling data is a value indicating a high-frequency component, in the first region H, and stores the second comparison value VthL, which is a threshold on a "low" side smaller than the first comparison value VthH, in the second region L.

The comparison value holding unit 4142 is configured by a part of a semiconductor memory which is a ROM.

The data comparison unit 4143 compares the value indicated by the sampling data read from the first region H in the data holding unit 4141 in synchronization with the clock signal CLK with the first comparison value VthH stored in the comparison value holding unit 4142, and gives the sampling point of the sampling data in which the value of the sampling data exceeds the first comparison value VthH to the trigger point extracting unit 4144 as a high-side sampling point.

In addition, the data comparison unit 4143 compares the value indicated by the sampling data read from the second region L in the data holding unit 4141 in synchronization with the clock signal CLK with the second comparison value VthL stored in the comparison value holding unit 4142, and gives a sampling point of the sampling data in which the value of the sampling data is less than the second comparison value VthL to the trigger point extracting unit 4144 as a low-side sampling point.

The data comparison unit 4143 monitors a magnitude relationship between the sampling data from the AD converter 3 temporarily stored in each of the first region H and the second region L in the data holding unit 4141 and the first comparison value VthH and the second comparison value VthL stored in the comparison value holding unit 4122 in real time.

When the data comparison unit 4143 extracts both the high-side sampling point and the low-side sampling point at a set number of successive sampling points, for example, eight sampling points that are the same as the pulse length S of the impulse signal assumed in advance or 10 sampling points that are $N_0$ sampling points at the decimation rate of $1/N_0$, the trigger point extracting unit 4144 gives either the extracted high-side sampling point or the extracted low-side sampling point to the decimation determination unit 413 as the trigger point.

The trigger point is represented as a count value CNT of the counter 411 associated with the sampling data by the first region H or the second region L in the data holding unit 4141 at the selected sampling point.

The trigger point extracting unit 4144 is a counter that counts the number of high-side sampling points and the number of low-side sampling points given from the data comparison unit 4143.

For example, when the high-side sampling point is given from the data comparison unit 4143 to the trigger point extracting unit 4144, the number of high-side sampling points is set to 1, and when the low-side sampling point is given from the data comparison unit 4143 between a sampling point given a high-side sampling point and a sampling point of a set number of successive sampling points, the number of low-side sampling points is set to 1, and both the number of high-side sampling points and the number of low-side sampling points indicate 1. Therefore, the trigger point extracting unit 4144 regards that an impulsive high-frequency signal is generated, and gives the trigger point to the decimation determination unit 413. At the same time, the number of counters as the trigger point extracting unit 4144 is reset to 0 by giving the trigger points to the decimation determination unit 413.

That is, the presence of the sampling data exceeding the first comparison value VthH and the sampling data less than the second comparison value VthL at the set number of successive sampling points means that a large amplitude signal is superimposed on the analog signal, and detection of the large amplitude signal can be regarded as generation of the impulsive high-frequency signal.

Note that an example in which the high-side sampling point is given from the data comparison unit 4143 to the trigger point extracting unit 4144 and then the low-side sampling point is given is illustrated, but conversely, the same applies to a case where the high-side sampling point is given after the low-side sampling point is given.

In addition, for example, when the trigger point extracting unit 4144 counts the number of low-side sampling points from the data comparison unit 4143 twice and counts the number of high-side sampling points once at a set number of successive sampling points, the trigger point extracting unit 4144 regards that an impulsive high-frequency signal is generated and gives the trigger points to the decimation determination unit 413.

That is, it means that at a set number of successive sampling points, a large amplitude signal from the low side sampling data less than the second comparison value VthL to the high side sampling data exceeding the first comparison value VthH, and further to the low side sampling data less than the second comparison value VthL, that is, a large amplitude signal in which the sampling data at the low side sampling point is present before and after the sampling data at the high side sampling point is superimposed on the analog signal, and the generation of the impulsive high-frequency signal can be detected with higher accuracy.

Note that, although the example in which the trigger point extracting unit 4144 is provided with the low-side sampling point, the high-side sampling point, and the low-side sampling point in this order from the data comparison unit 4143 has been described, the same applies to a case where the trigger point extracting unit is provided with the high-side sampling point, the low-side sampling point, and the high-side sampling point in this order.

In addition, it may be assumed that the impulsive high-frequency signal is generated when the trigger point extracting unit 4144 count the number of low-side sampling points and the number of high-side sampling points from the data comparison unit 4143 a plurality of times.

The data comparison unit 4143 and the trigger point extracting unit 4144 are configured by a microprocessor.

The operation of the AD conversion device 1 that stores the sampling data output from the AD converter 3 in the storage region of the storage unit 5 is substantially the same as that of the AD conversion device 1 according to the first embodiment, except that the trigger determination unit 414 extracts trigger points differently from the AD conversion device 1 according to the first embodiment.

FIG. 10 illustrates an example of sampling data in the high-speed sampling region HR and the decimation region DR stored in the storage region of the storage unit 5 in the AD conversion device 1 according to the fourth embodiment.

In FIG. 10, sampling points in the sampling data to which the write-enable signal indicating write-enabled is given are indicated by black circles, and sampling points in the sampling data to which the write-enable signal indicating write-disabled is given are indicated by white circles.

As can be understood from FIG. 10, the AD conversion device 1 according to the fourth embodiment also has the same effects as those of the AD conversion device 1 according to the first embodiment.

Moreover, in the AD conversion device 1 according to the fourth embodiment, when the data comparison unit 4143 extracts both the high-side sampling point and the low-side sampling point at the set number of successive sampling points, the trigger point extracting unit 4144 uses either the extracted high-side sampling point or low-side sampling point as the trigger point, so that the generation of the impulsive high-frequency signal can be detected with higher accuracy.

Furthermore, the AD conversion device 1 according to the fourth embodiment can detect generation of an impulsive high-frequency signal even when a digital signal obtained by converting an input analog signal into digital data by the AD converter 3 with a sampling frequency is a rectangular wave as illustrated in FIG. 11, and the impulsive high-frequency signal is superimposed on a falling portion (Tf portion) falling from an H level to an L level.

Note that, since the case where the impulsive high-frequency signal is superimposed on a rising portion (Tr portion) rising from the L level to the H level is similar to the case where the impulsive high-frequency signal is superimposed on the Tf portion, hereinafter, a case where the impulsive high-frequency signal is superimposed on the Tf portion will be described as a representative.

The difference between the first comparison value VthH and the second comparison value VthL stored in the comparison value holding unit 4142 is a value larger than the difference between the values of the sampling data for adjacent, that is, two successive sampling points in the Tf portion where the impulsive high-frequency signal is not superimposed.

In addition, the data comparison unit 4143 divides the H level to the L level into a plurality of regions in the Tf portion, and compares the first comparison value VthH and the second comparison value VthL obtained by sequentially subtracting the correction value from the H level for each of the plurality of regions with the sampling data from the AD converter 3 temporarily stored in each of the first region H and the second region L in the data holding unit 4141.

Alternatively, the first comparison value VthH and the second comparison value VthL stored in the comparison value holding unit 4142 are values when the sampling data from the AD converter 3 is at the H level, and the data comparison unit 4143 compares, in the Tf portion, the first comparison value VthH and the second comparison value VthL obtained by sequentially subtracting, as correction values, differences between the values of the sampling data for two successive sampling points each time a sampling point advances by one from the H level with the sampling data from the AD converter 3 temporarily stored in each of the first region H and the second region L in the data holding unit 4141.

Therefore, in a case where the impulsive high-frequency signal is not superimposed in the Tf portion, the sampling data temporarily stored in each of the first region H and the second region L in the data holding unit 4141 does not exceed the first comparison value VthH to which the correction value is given and does not become less than the second comparison value VthL to which the correction value is given.

In addition, in the displacement section from the L level to the H level, the sampling data temporarily stored in each of the first region H and the second region L in the data holding unit 4141 does not become less than the second comparison value VthL unless the impulsive high-frequency signal is superimposed.

In the displacement section from the H level to the L level, the sampling data temporarily stored in each of the first region H and the second region L in the data holding unit

4141 does not exceed the first comparison value VthH unless the impulsive high-frequency signal is superimposed.

Therefore, there is no erroneous detection in the displacement section from the L level to the H level and the displacement section from the H level to the L level.

In a case where the impulsive high-frequency signal is superimposed in the Tf portion, as illustrated in FIG. 11, the sampling data of sampling points exceeding the first comparison value VthH to which the correction value is given and the sampling data of sampling points less than the second comparison value VthL to which the correction value is given are present in the sampling data temporarily stored in each of the first region H and the second region L in the data holding unit 4141.

As a result, the AD conversion device 1 according to the fourth embodiment can detect the generation of the impulsive high-frequency signal even when the impulsive high-frequency signal is superimposed in the Tf portion.

Furthermore, the AD conversion device 1 according to the fourth embodiment can detect generation of an impulsive high-frequency signal even in a case where the impulsive high-frequency signal is superimposed in the Tr portion.

In this case, the first comparison value VthH and the second comparison value VthL stored in the comparison value holding unit 4142 are values when the sampling data from the AD converter 3 is at the L level, and the data comparison unit 4143 compares, in the Tf portion, the first comparison value VthH and the second comparison value VthL obtained by sequentially adding, as correction values, differences between the values of the sampling data for two successive sampling points each time a sampling point advances by one from the L level with the sampling data from the AD converter 3 temporarily stored in each of the first region H and the second region L in the data holding unit 4141.

Note that, in order to avoid complication of the description, the first comparison value VthH and the second comparison value VthL stored in the comparison value holding unit 4142 are values when the sampling data is at the H level in the description of the Tf portion, and are values when the sampling data is at the L level in the description of the Tr portion. However, the first comparison value VthH and the second comparison value VthL stored in the comparison value holding unit 4142 are values when the sampling data is at the L level. The data comparison unit 4143 compares the first comparison value VthH and the second comparison value VthL obtained by sequentially adding the correction values each time the sampling point advances by one from the L level in the Tr portion, and sequentially subtracting the correction values each time the sampling point advances by one from the values to which the correction values in the H level are added in the Tf portion with the sampling data from the AD converter 3 temporarily stored in each of the first region H and the second region L in the data holding unit 4141.

The AD conversion device 1 according to the fourth embodiment configured as described above also has effects similar to those of the AD conversion device 1 according to the first embodiment.

In addition, when the data comparison unit 4143 extracts both the high-side sampling point and the low-side sampling point at a set number of successive sampling points, the trigger point extracting unit 4144 uses any one of the extracted high-side sampling point and low-side sampling point as a trigger point, so that generation of an impulsive high-frequency signal can be detected with higher accuracy.

Furthermore, in a case where a digital signal obtained by converting an input analog signal into digital data by the AD converter 3 with a sampling frequency is a rectangular wave, when an impulsive high-frequency signal is superimposed in a Tr portion and a Tf portion which are not flat portions as well as a flat portion in the rectangular wave, generation of the impulsive high-frequency signal can be detected.

Note that, in the AD conversion device 1 according to the fourth embodiment, instead of outputting the write-enable signal indicating write-enabled for the sampling data at all the sampling points in the high-speed sampling region HR by the decimation determination unit 413 in the decimation control unit 41, as described in the third embodiment, the high-speed sampling region HR may include the first region having the decimation rate of 1 including the reference point and the second region continuous with the first region and sampled at the decimation rate of $1/N_1$ for selecting one sampling point from $N_1$ sampling points, the $N_1$ having a value smaller than $N_0$, and the decimation determination unit 413 in the decimation control unit 41 may output the write-enable signal indicating write-enabled for the sampling data at all the sampling points in the first region and the sampling data at the selected sampling point for every $N_1$ sampling points among the sampling points in the second region.

That is, as described in the third embodiment, the decimation determination unit 413 in the AD conversion device 1 according to the fourth embodiment includes the decimation setting unit 4131 and the memory control unit 4132, the decimation setting unit 4131 has a plurality of decimation rates, the memory control unit 4132 determines the high-speed sampling region HR and the decimation region DR, may further divide the high-speed sampling region HR into a plurality of region, output the write-enable signal indicating write-enabled for all the sampling data present in the first region HR1 of the high-speed sampling region HR, and perform sampling at a decimation rate of $1/N_1$ or the like larger than the decimation rate of $1/N_0$ for the decimation region DR on the remaining region HR2 or the like, and output a write-enable signal indicating write-enabled for sampling data at the selected sampling point for every $N_1$ or the like sampling points, the $N_1$ having a value smaller than the $N_0$, among the sampling points in the remaining region HR2 or the like.

Fifth Embodiment

An AD conversion device 1 according to a fifth embodiment will be described with reference to FIGS. 12 to 14.

While the trigger determination unit 412 in the AD conversion device 1 according to the second embodiment uses the sampling point of the sampling data in which the difference between the values of the two pieces of sampling data exceeds the difference comparison value as the trigger point, the AD conversion device 1 according to the fifth embodiment differs from the AD conversion device 1 according to the second embodiment only in the configuration in which the trigger determination unit 415 uses the sampling point of the sampling data in which the difference between the values of the two pieces of sampling data exceeds the difference comparison value as a trigger candidate sampling point, and when extracting a plurality of trigger candidate sampling points at a set number of successive sampling points, uses any sampling point of the trigger candidate sampling points is used as the trigger point, and the other points are the same.

Figure 12:
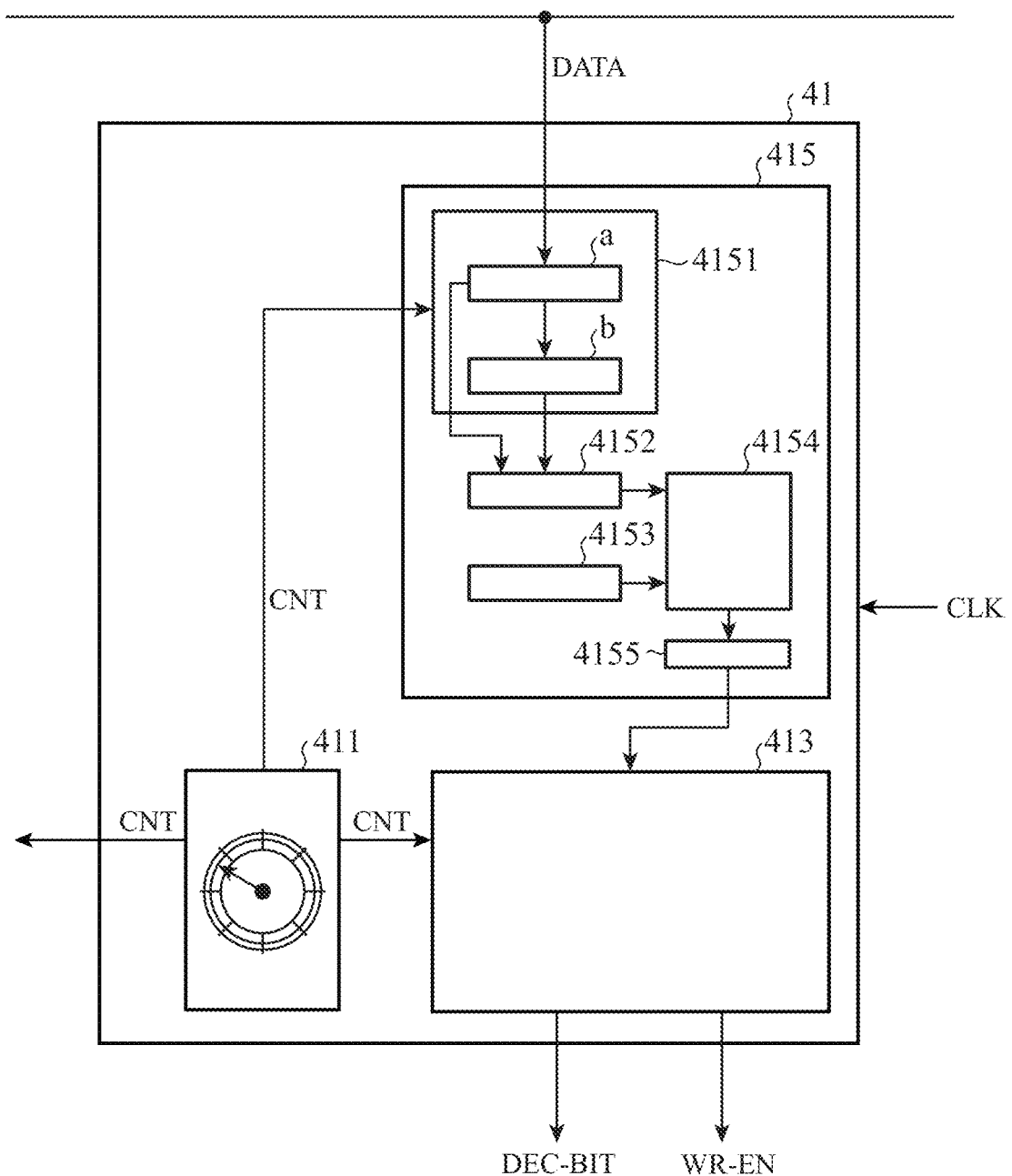
FIG. 12 is a block diagram illustrating a main part of an AD conversion device according to a fifth embodiment.
Figure 13:
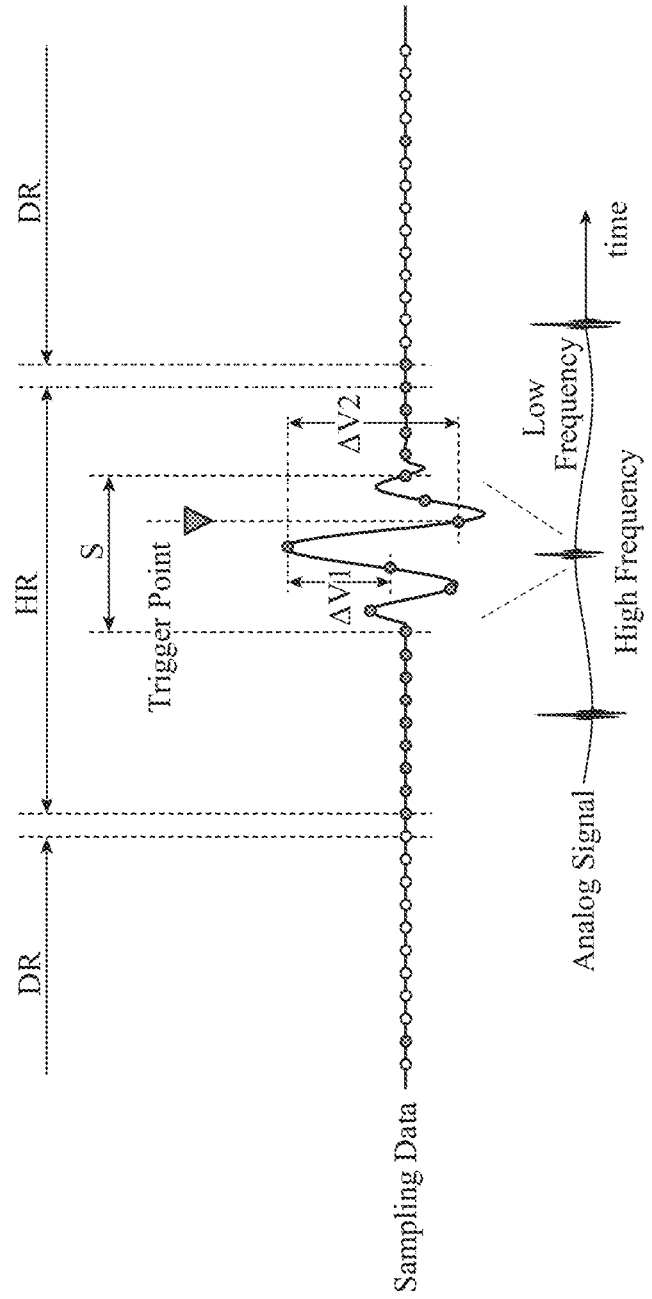
FIG. 13 is a diagram illustrating a relationship between a waveform of an analog input signal and sample points in the AD conversion device according to the fifth embodiment.
Figure 14:
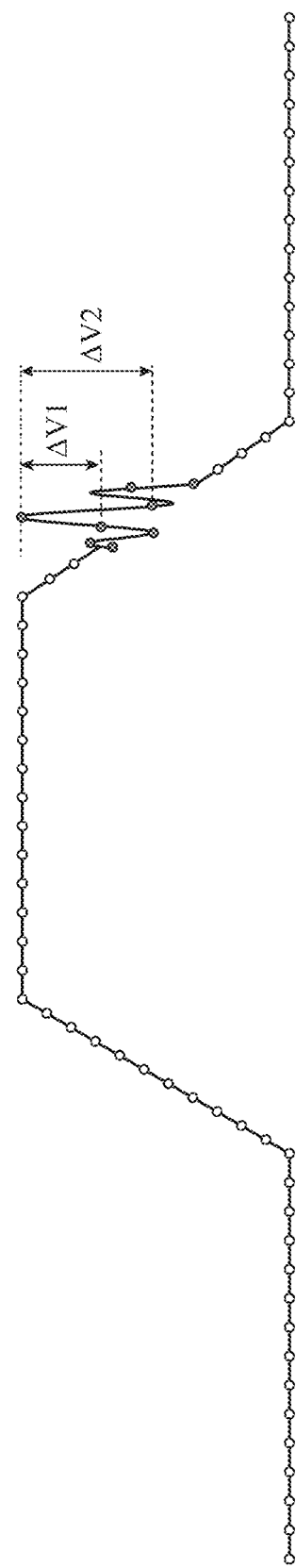
FIG. 14 is a diagram illustrating a waveform in which noise is superimposed on a falling portion of a rectangular wave in an input signal together with sample points in the AD conversion device according to the fifth embodiment.

Note that in FIGS. 12 to 14, the same reference numerals as those in FIGS. 1 to 6 denote the same or corresponding parts.

Therefore, the trigger determination unit 415 will be mainly described.

The trigger determination unit 415 includes a 2-data holding unit 4151, a difference calculation unit 4152, a difference comparison value holding unit 4153, a data difference comparison unit 4154, and a trigger point extracting unit 4155.

The 2-data holding unit 4151 temporarily stores the sampling data from the AD converter 3 for every adjacent, that is, two successive sampling points in time series.

When temporarily storing each of the two pieces of sampling data, the 2-data holding unit 4151 stores the sampling data in association with the count value CNT of the counter 411.

The 2-data holding unit 4151 is a register inside the microprocessor and has a first region a and a second region b.

The 2-data holding unit 4151 sequentially stores and reads the sampling data one by one in time series in association with the count value CNT of the counter 411 in synchronization with the clock signal CLK in the first region a, and the sampling data associated with the count value CNT temporarily stored in the first region a is shifted to the second region b in synchronization with the clock signal CLK, and the sampling data associated with the count value CNT temporarily stored in the shifted second region b is read out.

Each of the storage capacities of the first region a and the second region b in the register constituting the 2-data holding unit 4151 only needs to be the sum of the number of bits of the sampling data and the number of bits indicating the count value CNT of the counter 411.

The difference calculation unit 4152 calculates a difference between the values of the two pieces of sampling data temporarily stored in the 2-data holding unit 4151.

The difference calculation unit 4152 is a subtraction unit that subtracts the value of the sampling data stored in the second region b from the value of the sampling data stored in the first region a of the 2-data holding unit 4151, and outputs an absolute value of the subtracted value.

The difference comparison value holding unit 4153 stores a difference comparison value that is a threshold of a difference between values of sampling data for two adjacent sampling points for determining whether or not the sampling data is a value indicating a high-frequency component.

The difference comparison value holding unit 4153 is configured by a part of a semiconductor memory which is a ROM.

The data difference comparison unit 4154 compares the absolute value of the difference calculated by the difference calculation unit 4152 with the difference comparison value stored in the difference comparison value holding unit 4153 in synchronization with the clock signal CLK, and when the absolute values $\Delta V1$ and $\Delta V2$ of the difference calculated by the difference calculation unit 4152 exceed the difference comparison value, a sampling point at which the difference between the values of two adjacent pieces of sampling data temporarily stored in the first region a and the second region b is large, that is, the amount of change is large is given to the trigger point extracting unit 4155 as a trigger candidate sampling point.

The data difference comparison unit 4154 monitors a magnitude relationship between the absolute value of the difference calculated by the difference calculation unit 4152 and the difference comparison value stored in the difference comparison value holding unit 4153 in real time.

When the data difference comparison unit 4154 extracts a plurality of trigger candidate sampling points, that is, at least two trigger candidate sampling points, at sampling points of a set number of successive sampling points, for example, eight sampling points which are the same as the pulse length S of the impulse signal assumed in advance or 10 sampling points which are $N_0$ sampling points at the decimation rate of $1/N_0$, the trigger point extracting unit 4155 gives any one of the plurality of extracted trigger candidate sampling points to the decimation determination unit 413 as a trigger point.

The trigger point is represented as a count value CNT of the counter 411 associated with the sampling data by the first region a or the second region b in the data holding unit 4141 at the selected sampling point.

The trigger point extracting unit 4155 is a counter that counts the number of trigger candidate sampling points provided from the data difference comparison unit 4154.

For example, when trigger candidate sampling points are given from the data difference comparison unit 4154 to the trigger point extracting unit 4155, the number of trigger candidate sampling points is set to 1, and when trigger candidate sampling points are given from the data difference comparison unit 4154 between sampling points given with the trigger candidate sampling points and sampling points of a set number of successive sampling points, the number of trigger candidate sampling points is set to 2, and the trigger point extracting unit 4155 assumes that an impulsive high-frequency signal is generated and gives the trigger points to the decimation determination unit 413. At the same time, the number of counters is reset to 0.

That is, the fact that the absolute values $\Delta V1$ and $\Delta V2$ of the differences calculated by the difference calculation unit 4152 exceed the difference comparison value stored in the difference comparison value holding unit 4153 by 2 degrees at a set number of successive sampling points means that the difference between the values of two adjacent pieces of sampling data temporarily stored in the first region a and the second region b is large, and exceeds the difference comparison value by plus or minus, in other words, a signal having a steep time variation between the pieces of sampling data is superimposed on the analog signal, and detection of the fact can be regarded as generation of the impulsive high-frequency signal.

The difference calculation unit 4152, the data difference comparison unit 4154, and the trigger point extracting unit 4155 are configured by a microprocessor.

The operation of the AD conversion device 1 that stores the sampling data output from the AD converter 3 in the storage region of the storage unit 5 is substantially the same as that of the AD conversion device 1 according to the second embodiment, except that the trigger determination unit 414 extracts trigger points differently from the AD conversion device 1 according to the second embodiment.

FIG. 13 illustrates an example of sampling data in the high-speed sampling region HR and the decimation region DR stored in the storage region of the storage unit 5 in the AD conversion device 1 according to the fifth embodiment.

In FIG. 13, sampling points in the sampling data to which the write-enable signal indicating write-enabled is given are indicated by black circles, and sampling points in the sampling data to which the write-enable signal indicating write-disabled is given are indicated by white circles.

As can also be understood from FIG. 13, the AD conversion device 1 according to the fifth embodiment also has the same effects as those of the AD conversion device 1 according to the second embodiment.

Moreover, in the AD conversion device 1 according to the fifth embodiment, when the data difference comparison unit 4154 extracts a plurality of trigger candidate sampling points at a set number of successive sampling points, the trigger point extracting unit 4155 uses any one of the plurality of extracted trigger candidate sampling points as the trigger point, so that the generation of the impulsive high-frequency signal can be detected with higher accuracy.

Furthermore, the AD conversion device 1 according to the fifth embodiment can detect the generation of the impulsive high-frequency signal even when the digital signal obtained by converting the input analog signal into the digital data by the AD converter 3 with the sampling frequency is a rectangular wave as illustrated in FIG. 14, and the impulsive high-frequency signal is superimposed in the Tf portion.

Note that the case where the impulsive high-frequency signal is superimposed in the Tr portion is also similar to the case where the impulsive high-frequency signal is superimposed in the Tf portion. Therefore, the case where the impulsive high-frequency signal is superimposed in the Tf portion will be described below as a representative.

The difference comparison value stored in the difference comparison value holding unit 4126 is preferably a value larger than the difference between the values of the sampling data for adjacent, that is, two successive sampling points in the Tf portion where the impulsive high-frequency signal is not superimposed.

In a case where the impulsive high-frequency signal is not superimposed in the Tf portion, the absolute value of the difference calculated by the difference calculation unit 4152 does not exceed the difference comparison value stored in the difference comparison value holding unit 4153 by 2 degrees, and the trigger point extracting unit 4155 does not count the trigger candidate sampling points by 2 degrees at the set number of successive sampling points.

In addition, in the displacement section from the L level to the H level, the absolute value of the difference calculated by the difference calculation unit 4152 does not exceed the difference comparison value stored in the difference comparison value holding unit 4153 by 2 degrees unless the impulsive high-frequency signal is superimposed.

In the displacement section from the H level to the L level, unless the impulsive high-frequency signal is superimposed, the absolute value of the difference calculated by the difference calculation unit 4152 does not exceed the difference comparison value stored in the difference comparison value holding unit 4153 by 2 degrees.

Therefore, there is no erroneous detection in the displacement section from the L level to the H level and the displacement section from the H level to the L level.

In a case where the impulsive high-frequency signal is superimposed in the Tf portion, as illustrated in FIG. 14, the absolute value ΔV1 of the difference calculated by the difference calculation unit 4152 exceeds the difference comparison value stored in the difference comparison value holding unit 4153, the absolute value ΔV2 of the difference calculated by the difference calculation unit 4152 exceeds the difference comparison value stored in the difference comparison value holding unit 4153, and the trigger point extracting unit 4155 counts two trigger candidate sampling points.

As a result, the AD conversion device 1 according to the fifth embodiment can detect the generation of the impulsive high-frequency signal even when the impulsive high-frequency signal is superimposed in the Tf portion.

In addition, the AD conversion device 1 according to the fifth embodiment can detect the generation of the impulsive high-frequency signal similarly to the case of the Tf portion even when the impulsive high-frequency signal is superimposed in the Tr portion.

The AD conversion device 1 according to the fifth embodiment configured as described above also has effects similar to those of the AD conversion device 1 according to the second embodiment.

In addition, when the data difference comparison unit 4154 extracts a plurality of trigger candidate sampling points at a set number of successive sampling points, the trigger point extracting unit 4144 uses any one of the plurality of extracted trigger candidate sampling points as a trigger point, so that generation of an impulsive high-frequency signal can be detected with higher accuracy.

Furthermore, in a case where a digital signal obtained by converting an input analog signal into digital data by the AD converter 3 with a sampling frequency is a rectangular wave, when an impulsive high-frequency signal is superimposed in a Tr portion and a Tf portion which are not flat portions as well as a flat portion in the rectangular wave, generation of the impulsive high-frequency signal can be detected.

Note that, in the AD conversion device 1 according to the fifth embodiment, instead of outputting the write-enable signal indicating write-enabled for the sampling data at all the sampling points in the high-speed sampling region HR by the decimation determination unit 413 in the decimation control unit 41, and as described in the third embodiment, the high-speed sampling region HR may include the first region including the reference point and having the decimation rate of 1, and the second region continuous with the first region and sampled at the decimation rate of $1/N_1$ for selecting one sampling point from $N_1$ sampling points, the $N_1$ having a value smaller than $N_0$, and the decimation determination unit 413 in the decimation control unit 41 may output the write-enable signal indicating write-enabled to the sampling data at all the sampling points in the first region and the sampling data at the selected sampling point for every $N_1$ sampling points among the sampling points in the second region.

That is, as described in the third embodiment, the decimation determination unit 413 in the AD conversion device 1 according to the fifth embodiment includes the decimation setting unit 4131 and the memory control unit 4132, the decimation setting unit 4131 has a plurality of decimation rates, the memory control unit 4132 determines the high-speed sampling region HR and the decimation region DR, further divides the high-speed sampling region HR into a plurality of regions, and outputs the write-enable signal indicating write-enabled for all the sampling data present in the first region HR1 of the high-speed sampling region HR, and sampling may be performed at a decimation rate of $1/N_1$ or the like larger than the decimation rate of $1/N_0$ for the decimation region DR on the remaining region HR2 or the like, and a write-enable signal indicating write-enabled may be output for sampling data at the selected sampling point for every $N_1$ or the like sampling points, the $N_1$ having a value smaller than the $N_0$, among the sampling points in the remaining region HR2 or the like.

Note that it is possible to freely combine the embodiments, to modify any components of the embodiments, or to omit any components in the embodiments.

INDUSTRIAL APPLICABILITY

The AD conversion device 1 according to the present disclosure is suitable for the AD conversion device 1 used for various sensing devices and wireless communication devices.

In addition, the device is applicable to the AD conversion device 1 in which the high-frequency signal superimposed on the analog signal input to the AD converter 3 is an impulsive high-frequency signal represented by electrostatic discharge noise.

REFERENCE SIGNS LIST

1: AD conversion device, 2: Amplifier circuit, 3: AD Converter, 4: Control unit (Controller), 41: Decimation control unit (Decimation controller), 411: Counter, 412: Trigger determination unit (Trigger determiner), 4121: 1-data holding unit (1-data holder), 4122: Comparison value holding unit (Comparison value holder), 4123: Data comparison unit (Data comparator), 4124: 2-data holding unit (2-data holder), 4125: Difference calculation unit (Difference calculator), 4126: Difference comparison value holding unit (Difference comparison value holder), 4127: Data difference comparison unit (Data difference comparator), 413: Decimation determination unit (Decimation determiner), 4131: Decimation setting unit (Decimation setter), 4132: Memory control unit (Memory controller), 414: Trigger determination unit (Trigger determiner), 4141: Data holding unit (Data holder), 4142: Comparison value holding unit (Comparison value holder), 4143: Data comparison unit (Data comparator), 4144: Trigger point extracting unit (Trigger point extractor), 415: Trigger determination unit (Trigger determiner), 4151: 2-data holding unit (2-data holder), 4152: Difference calculation unit (Difference calculator), 4153: Difference comparison value holding unit (Difference comparison value holder), 4154: Data difference comparison unit (Data difference comparator), 4155: Trigger point extracting unit (Trigger point extractor), 42: Buffer memory, 5: Storage unit (Storage circuit), DR: Decimation region, HR: High-speed sampling region

What is claimed is:

1. An AD conversion device comprising:
   an AD converter to convert an analog signal into digital data for every sampling point based on a sampling frequency and to output the digital data as sampling data for every sampling point;
   a controller including a buffer memory in which the sampling data from the AD converter is temporarily stored in time series and from which the sampling data is read out in time series, and a decimation controller, wherein the decimation controller monitors whether or not the analog signal contains a high-frequency component, when the analog signal contains the high-frequency component, uses a sampling point in the sampling data from the AD converter containing the high-frequency component, as a reference point, sets a region having the reference point and sampling points before and after the reference point, as a high-speed sampling region, sets a region other than the high-speed sampling region, as a decimation region in which sampling is performed at a decimation rate of $1/N_0$ for selecting one sampling point from $N_0$ sampling points, outputs a write-enable signal indicating write-enabled for the sampling data at the selected sampling point for every $N_0$ sampling points among the sampling points in the decimation region and the sampling data at all sampling points in at least a partial region in the high-speed sampling region, and outputs decimation bit information indicating whether the sampling data is sampling data at a sampling point in the decimation region or sampling data at a sampling point in the high-speed sampling region; and
   a storage circuit to receive the sampling data stored in the buffer memory, the write-enable signal and the decimation bit information from the decimation controller, and to store the sampling data stored in the buffer memory at a sampling point at which the write-enable signal indicating write-enabled is received from the decimation controller and the decimation bit information from the decimation controller in association with each other,
   wherein the decimation controller includes:
   a counter to operate with the $N_0$ as an upper limit value of a count value and to output the count value;
   a trigger determiner to monitor whether or not the analog signal contains a high-frequency component with the sampling data from the AD converter, and to detect a sampling point in the sampling data containing the high-frequency component as a trigger point; and
   a decimation determiner to use a reference point of the high-speed sampling region as the trigger point detected by the trigger determiner, and to determine the selected sampling point for every $N_0$ sampling points among the sampling points in the decimation region with a count value from the counter, and
   the buffer memory stores the count value from the counter for every sampling point in association with the sampling data from the AD converter.

2. The AD conversion device according to claim 1, wherein
   the trigger determiner includes:
   a 1-data holder to temporarily store the sampling data from the AD converter in time series for every sampling point;
   a comparison value holder to store a comparison value; and
   a data comparator to compare a value indicated by the sampling data temporarily stored in the 1-data holder with a comparison value stored in the comparison value holder, and to set the trigger point as a sampling point of sampling data in which the value of the sampling data exceeds the comparison value.

3. The AD conversion device according to claim 1, wherein
   the trigger determiner includes:
   a 2-data holder to temporarily store sampling data in time series for every sampling data at two adjacent sampling points from the AD converter;
   a difference calculator to calculate a difference between values indicated by two pieces of sampling data temporarily stored in the 2-data holder;
   a difference comparison value holder to store a difference comparison value; and
   a data difference comparator to compare a value of the difference calculated by the difference calculator with a difference comparison value stored in the difference comparison value holder, and to set the trigger point as a sampling point of sampling data in which a value of the calculated difference exceeds the difference comparison value.

4. The AD conversion device according to claim 1, wherein the decimation controller outputs a write-enable signal indicating write-enabled for sampling data at all sampling points in the high-speed sampling region.

5. The AD conversion device according to claim 1, wherein the high-speed sampling region includes a first region that includes the reference point and has a decimation rate of 1, and a second region which is continuous with the first region and in which sampling is performed at a decimation rate of $1/N_1$ for selecting one sampling point from $N_1$ sampling points, the $N_1$ having a value smaller than the $N_0$, and the decimation controller outputs a write-enable signal indicating write-enabled for sampling data at all sampling points in the first region and sampling data at the selected sampling point for every $N_1$ sampling points among the sampling points in the second region.

6. An AD conversion device comprising:

an AD converter to convert an analog signal into digital data for every sampling point based on a sampling frequency and to output the digital data as sampling data for every sampling point;

a controller including a buffer memory in which the sampling data from the AD converter is temporarily stored in time series and from which the sampling data is read out in time series, and a decimation controller, wherein the decimation controller monitors whether or not the analog signal contains a high-frequency component, when the analog signal contains the high-frequency component, uses a sampling point in the sampling data from the AD converter, containing the high-frequency component, as a reference point, sets a region including a first region and a second region as a high-speed sampling region, the first region having the reference point and sampling points before and after the reference point, the first region having a decimation rate of 1, the second region being continuous with the first region, the second region having sampling points, and in the second region, sampling being performed at a decimation rate of $1/N_1$ for selecting one sampling point from $N_1$ sampling points, the $N_1$ having a value smaller than the $N_0$, sets a region other than the high-speed sampling region, as a decimation region in which sampling is performed at a decimation rate of $1/N_0$ for selecting one sampling point for every $N_0$ sampling points, outputs a write-enable signal indicating write-enabled for sampling data at the selected sampling point for every $N_0$ sampling points among the sampling points in the decimation region, sampling data at all sampling points in the high-speed sampling region, and sampling data at the selected sampling point for every $N_1$ sampling points among the sampling points in the second region, and outputs decimation bit information indicating whether the sampling data is sampling data at a sampling point in the decimation region or sampling data at a sampling point in the high-speed sampling region; and a storage circuit to receive the sampling data stored in the buffer memory, the write-enable signal and the decimation bit information from the decimation controller, and to store the sampling data stored in the buffer memory at a sampling point at which the write-enable signal indicating write-enabled is received from the decimation controller and the decimation bit information from the decimation controller in association with each other, wherein the decimation controller includes:

a trigger determiner to monitor whether or not the analog signal contains a high-frequency component with sampling data from the AD converter, and to detect a sampling point in the sampling data containing the high-frequency component as a trigger point;

a counter to operate with the $N_0$ as an upper limit value of a count value and to output the count value; and a decimation determiner to use a reference point of the high-speed sampling region as the trigger point detected by the trigger determiner, and to determine the selected sampling point for every $N_1$ sampling points among the sampling points in the second region with a count value from the counter, and to determine the selected sampling point for every $N_0$ sampling points among the sampling points in the decimation region with the count value from the counter, and the buffer memory stores the count value from the counter for every sampling point in association with the sampling data from the AD converter.

7. The AD conversion device according to claim 6, wherein the trigger determiner includes:

a 1-data holder to temporarily store sampling data from the AD converter in time series for every sampling point;

a comparison value holder to store a comparison value; and a data comparator to compare the sampling data temporarily stored in the 1-data holder with the comparison value stored in the comparison value holder, and to set the trigger point as a sampling point of sampling data in which a value of the sampling data exceeds the comparison value.

8. The AD conversion device according to claim 6, wherein the trigger determiner includes:

a 2-data holder to temporarily store sampling data in time series for every sampling data at two adjacent sampling points from the AD converter;

a difference calculator to calculate a difference between values of two pieces of sampling data temporarily stored in the 2-data holder;

a difference comparison value holder to store a difference comparison value; and a data difference comparator to compare a value of the difference calculated by the difference calculator with the difference comparison value stored in the difference comparison value holder, and to set the trigger point as a sampling point of sampling data in which a value of the calculated difference exceeds the difference comparison value.

9. The AD conversion device according to claim 1, wherein the trigger determiner includes:

a data holder to temporarily store sampling data from the AD converter in time series for every sampling point;

a comparison value holder to store a first comparison value and a second comparison value smaller than the first comparison value;

a data comparator to compare a value indicated by the sampling data temporarily stored in the data holder with a first comparison value and a second comparison value stored in the comparison value holder, to set a sampling point of sampling data in which a value of the compared sampling data exceeds the first comparison value as a high-side sampling point, and to set a sampling point of sampling data in which a value of the compared sampling data is less than the second comparison value as a low-side sampling point; and a trigger point extractor to set, when the data comparator extracts the high-side sampling point and the low-side sampling point at a set number of successive sampling points, any sampling point of the extracted high-side sampling point and low-side sampling point as the trigger point.

10. The AD conversion device according to claim 1, wherein
the trigger determiner includes:
a data holder to temporarily store sampling data from the AD converter in time series for every sampling point;
a comparison value holder to store a first comparison value and a second comparison value smaller than the first comparison value;
a data comparator to compare a value indicated by the sampling data temporarily stored in the data holder with a first comparison value and a second comparison value stored in the comparison value holder, to set a sampling point of sampling data in which a value of the compared sampling data exceeds the first comparison value as a high-side sampling point, and to set a sampling point of sampling data in which a value of the compared sampling data is less than the second comparison value as a low-side sampling point; and
a trigger point extractor to set, when the data comparator extracts one sampling point of the high-side sampling point and the low-side sampling point twice and extracts the other sampling point of the high-side sampling point and the low-side sampling point once at a set number of successive sampling points, any sampling point of the extracted high-side sampling point and low-side sampling point as the trigger point.

11. The AD conversion device according to claim 1, wherein
the trigger determiner includes:
a data holder to temporarily store sampling data from the AD converter in time series for every sampling point;
a comparison value holder to store a first comparison value and a second comparison value smaller than the first comparison value;
a data comparator to compare a value indicated by the sampling data temporarily stored in the data holder with a first comparison value and a second comparison value stored in the comparison value holder, to set a sampling point of sampling data in which the compared value of the sampling data exceeds the first comparison value as a high-side sampling point, and to set a sampling point of sampling data in which the compared value of the sampling data is less than the second comparison value as a low-side sampling point; and
a trigger point extractor to set, when the data comparator extracts the low-side sampling point at the high-side sampling point and before and after the high-side sampling point at a set number of successive sampling points, any sampling point of the extracted high-side sampling point and low-side sampling point as the trigger point.

12. The AD conversion device according to claim 7, wherein the decimation controller outputs a write-enable signal indicating write-enabled for sampling data at all sampling points in the high-speed sampling region.

13. The AD conversion device according to claim 9, wherein
the high-speed sampling region includes a first region that includes the reference point and has a decimation rate of 1, and a second region which is continuous with the first region and in which sampling is performed at a decimation rate of $1/N_1$ for selecting one sampling point from $N_1$ sampling points, the $N_1$ having a value smaller than $N_0$, and
the decimation controller outputs a write-enable signal indicating write-enabled for sampling data at all sampling points in the first region and sampling data at the selected sampling point for every $N_1$ sampling points among the sampling points in the second region.

14. The AD conversion device according to claim 1, wherein
the trigger determiner includes:
a 2-data holder to temporarily store sampling data in time series for every sampling data at two adjacent sampling points from the AD converter;
a difference calculator to calculate a difference between values indicated by two pieces of sampling data temporarily stored in the 2-data holder;
a difference comparison value holder to store a difference comparison value;
a data difference comparator to compare a value of the difference calculated by the difference calculator with the difference comparison value stored in the difference comparison value holder, and to set a sampling point of sampling data in which the value of the calculated difference exceeds the difference comparison value as a trigger candidate sampling point; and
a trigger point extractor to set, when the data difference comparator extracts a plurality of the trigger candidate sampling points at a set number of successive sampling points, any sampling point of the extracted plurality of the trigger candidate sampling points as the trigger point.

15. The AD conversion device according to claim 14, wherein the decimation controller outputs a write-enable signal indicating write-enabled for sampling data at all sampling points in the high-speed sampling region.

16. The AD conversion device according to claim 14, wherein
the high-speed sampling region includes a first region that includes the reference point and has a decimation rate of 1, and a second region which is continuous with the first region and in which sampling is performed at a decimation rate of $1/N_1$ for selecting one sampling point from $N_1$ sampling points, the $N_1$ having a value smaller than the $N_0$, and
the decimation controller outputs a write-enable signal indicating write-enabled for sampling data at all sampling points in the first region and sampling data at the selected sampling point for every $N_1$ sampling points among the sampling points in the second region.

* * * * *